US012696798B2

(12) United States Patent
Then et al.

(10) Patent No.: US 12,696,798 B2
(45) Date of Patent: Jul. 28, 2026

(54) ACTIVE DEVICE LAYER AT INTERCONNECT INTERFACES

(71) Applicant: Intel Corporation, Santa Clara, CA (US)

(72) Inventors: Han Wui Then, Portland, OR (US); Adel A. Elsherbini, Tempe, AZ (US); Kimin Jun, Portland, OR (US); Johanna M. Swan, Scottsdale, AZ (US); Shawna M. Liff, Scottsdale, AZ (US); Sathya Narasimman Tiagaraj, San Jose, CA (US); Gerald S. Pasdast, San Jose, CA (US); Aleksandar Aleksov, Chandler, AZ (US); Feras Eid, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 69 days.

(21) Appl. No.: 17/344,348

(22) Filed: Jun. 10, 2021

(65) Prior Publication Data

US 2022/0399324 A1 Dec. 15, 2022

(51) Int. Cl.
*H10W 90/00* (2026.01)
*H10W 72/00* (2026.01)
(Continued)

(52) U.S. Cl.
CPC ....... *H10W 90/00* (2026.01); *H10W 72/0198* (2026.01); *H10P 90/1914* (2026.01);
(Continued)

(58) Field of Classification Search
CPC ..... H01L 25/50; H01L 24/97; H01L 25/0652; H01L 25/0657; H01L 21/76251;
(Continued)

(56) References Cited

U.S. PATENT DOCUMENTS 10,700,039 B2 6/2020 Nelson et al.
2010/0155932 A1* 6/2010 Gambino ............ H01L 27/0688
257/713
(Continued)

FOREIGN PATENT DOCUMENTS

CN 106558577 A 4/2017

OTHER PUBLICATIONS

International Search Report and Written Opinion in International Patent Application No. PCT/US2022/021669 dated Jul. 11, 2022, 12 pages.

*Primary Examiner* — Elias Ullah
(74) *Attorney, Agent, or Firm* — Akona IP PC

(57) ABSTRACT

A die assembly comprising: a first component layer having conductive through-connections in an insulator, a second component layer comprising a die, and an active device layer (ADL) at an interface between the first component layer and the second component layer. The ADL comprises active elements electrically coupled to the first component layer and the second component layer. The die assembly further comprises a bonding layer electrically coupling the ADL to the second component layer. In some embodiments, the die assembly further comprises another ADL at another interface between the first component layer and a package support opposite to the interface. The first component layer may comprise another die having through-substrate vias (TSVs). The die and the another die may be fabricated using different process nodes.

14 Claims, 10 Drawing Sheets

(51) Int. Cl.

| | |
|---|---|
| *H10P 90/00* | (2026.01) |
| *H10W 10/10* | (2026.01) |
| *H10W 20/20* | (2026.01) |
| *H10W 20/43* | (2026.01) |
| *H10W 20/44* | (2026.01) |
| *H10W 90/20* | (2026.01) |
| *H10W 99/00* | (2026.01) |

(52) U.S. Cl.

CPC .......... *H10W 10/181* (2026.01); *H10W 20/20* (2026.01); *H10W 20/43* (2026.01); *H10W 20/4441* (2026.01); *H10W 72/823* (2026.01); *H10W 90/297* (2026.01); *H10W 90/722* (2026.01); *H10W 90/732* (2026.01); *H10W 90/792* (2026.01); *H10W 99/00* (2026.01)

(58) Field of Classification Search

CPC ................. H01L 23/481; H01L 23/528; H01L 23/53257; H01L 24/08; H01L 24/16; H01L 24/32; H01L 24/92; H01L 2224/08145; H01L 2224/16145; H01L 2224/32145; H01L 2224/9211; H01L 2225/06541; H01L 2225/06548; H01L 2924/1033; H01L 21/568; H01L 23/3128; H01L 23/66; H01L 24/06; H01L 21/76898; H01L 24/25; H01L 24/48; H01L 24/73; H01L 24/80; H01L 25/18; H01L 2221/68345; H01L 2221/68359; H01L 2221/68372; H01L 2224/03002; H01L 2224/0401; H01L 2224/0603; H01L 2224/06181; H01L 2224/08225; H01L 2224/11002; H01L 2224/16227; H01L 2224/32225; H01L 2224/48227; H01L 2224/73204; H01L 2224/80006; H01L 2224/81005; H01L 2224/92125; H01L 2224/95; H01L 2924/1431; H01L 2924/1434; H01L 2924/15313; H01L 2924/18161; H01L 2924/3511; H01L 2924/3512; H01L 21/6835; H01L 2225/06513; H01L 2225/06517; H01L 2225/06586

See application file for complete search history.

(56) References Cited

U.S. PATENT DOCUMENTS

| | | | |
|---|---|---|---|
| 2015/0130068 A1 | 5/2015 | Lin et al. | |
| 2018/0040547 A1 | 2/2018 | Zuo et al. | |
| 2019/0006346 A1 | 1/2019 | Chao et al. | |
| 2020/0043831 A1 | 2/2020 | Cheah et al. | |
| 2021/0098421 A1 | 4/2021 | Wu et al. | |
| 2022/0037258 A1* | 2/2022 | Arifeen | H01L 24/73 |

* cited by examiner

270

130   132

122(1)
124(1)
102
112

104   122(2)
124(2)

108   108

264

262

280

106   100

108   108   124(2)
122(2)
112
132   124(1)
130   122(1)

284   282

ACTIVE DEVICE LAYER AT INTERCONNECT INTERFACES

TECHNICAL FIELD

The present disclosure relates to techniques, methods, and apparatus directed to active device layer (ADL) at interconnect interfaces in semiconductor integrated circuit (IC) packaging.

BACKGROUND

Electronic circuits when commonly fabricated on a wafer of semiconductor material, such as silicon, are called ICs. The wafer with such ICs is typically cut into numerous individual dies. The dies may be packaged into an IC package containing one or more dies along with other electronic components such as resistors, capacitors, and inductors. The IC package may be integrated onto an electronic system, such as a consumer electronic system.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Overview

Figure 1:
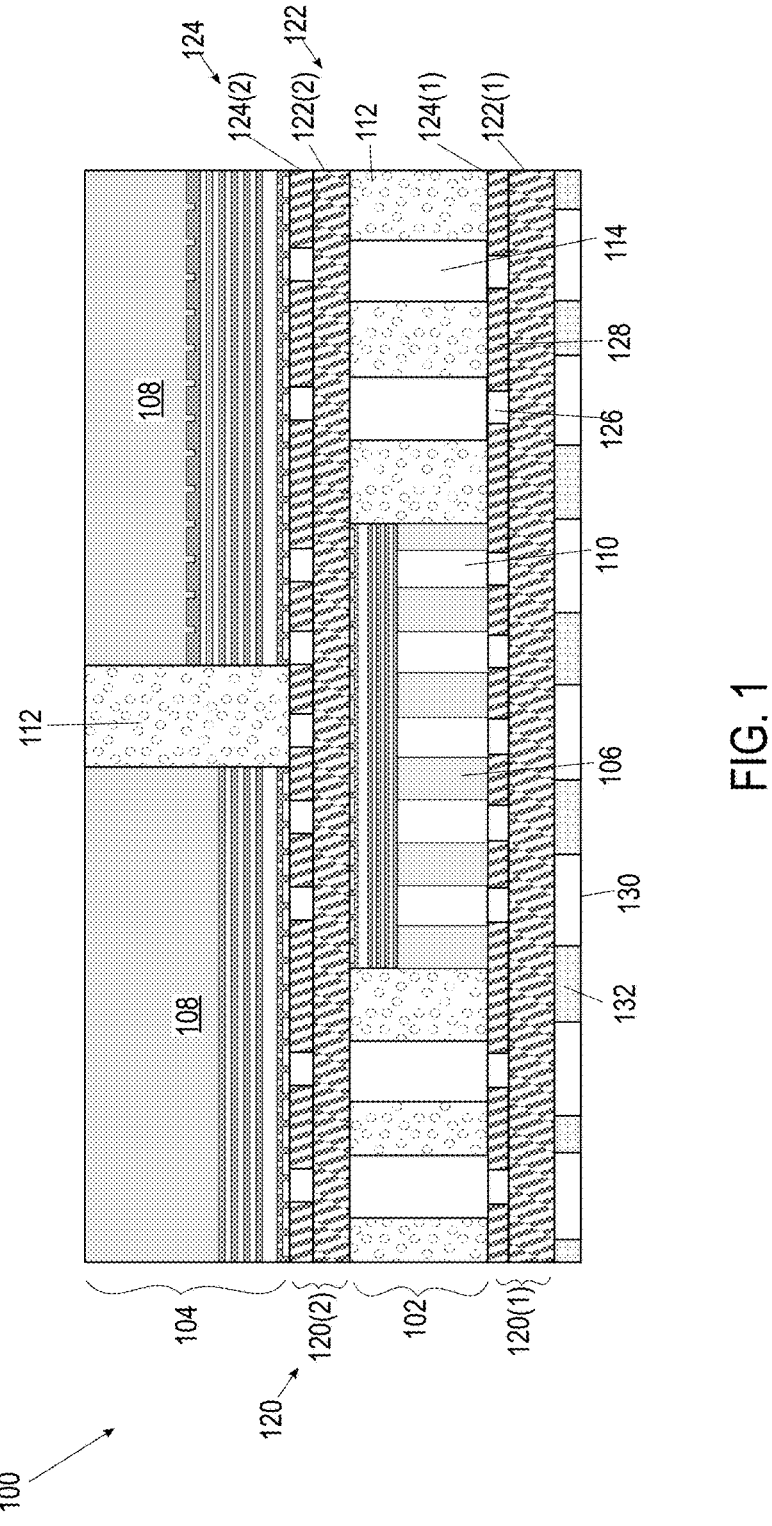
FIG. 1 is a schematic cross-sectional view of an example die assembly with ADLs, according to some embodiments of the present disclosure.

For purposes of illustrating IC packages described herein, it is important to understand phenomena that may come into play during assembly and packaging of ICs. The following foundational information may be viewed as a basis from which the present disclosure may be properly explained. Such information is offered for purposes of explanation only and, accordingly, should not be construed in any way to limit the broad scope of the present disclosure and its potential applications.

Advances in semiconductor processing have permitted an increase in the amount of circuit blocks (e.g., logic circuits) that may be included in processors and other IC devices. As a result, many processors now have multiple cores that are monolithically integrated on a single die. Generally, these types of monolithic ICs are also described as planar since they take the form of a flat surface and are typically built on a single silicon wafer made from a monocrystalline silicon boule. The typical manufacturing process for such monolithic ICs is called a planar process, allowing photolithography, etching, heat diffusion, oxidation, and other such processes to occur on the surface of the wafer, such that active circuit elements (e.g., transistors and diodes) are formed on the planar surface of the silicon wafer.

Current technologies permit hundreds and thousands of such active circuit elements to be formed on a single die so that numerous circuit blocks may be enabled thereon. In such monolithic dies, the manufacturing process must be optimized for all the circuit blocks equally, resulting in trade-offs between different circuit blocks. In addition, because of the limitation of having to place circuits on a planar surface, some circuit blocks are farther apart from some others, resulting in decreased performance such as longer delays. Manufacturing yield may also be severely impacted because the entire die may have to be discarded if even one circuit block is malfunctional.

One solution to overcome such negative impacts of monolithic dies is to disaggregate the circuits into smaller dies (e.g., chiplets, tiles) that are electrically coupled by interconnect bridges. Such smaller dies form part of an assembly of interconnected dies that together form a complete IC in terms of application and/or functionality, such as a memory chip, microprocessor, microcontroller, commodity IC (e.g., chip used for repetitive processing routines, simple tasks, application specific IC, etc.), and system-on-a-chip (SoC). In other words, the individual dies are connected together to create the functionalities of a monolithic IC. By using separate dies, each individual die can be designed and manufactured optimally for a particular functionality. For example, a processor core that contains logic circuits might aim for performance, and thus might require a very speed-optimized layout. This has different manufacturing requirements compared to a USB controller, which is built to meet certain USB standards, rather than for processing speed. Thus, by having different parts of the overall design separated into different dies, each one optimized in terms of design and manufacturing, the overall yield and cost of the combined die assembly solution may be improved.

The connectivity between these dies is achievable by many different ways. For example, in 2.5D packaging solutions, a silicon interposer and through-substrate vias (TSVs) connect dies at silicon interconnect speed in a minimal footprint. In another example, called Embedded Multi-Die Interconnect Bridge (EMIB), a silicon bridge embedded under the edges of two interconnecting dies facilitates electrical coupling between them. In a three-dimensional (3D) architecture, the dies are stacked one above the other, creating a smaller footprint overall. Typically, the electrical connectivity and mechanical coupling in such 3D architecture is achieved using TSVs and high pitch solder-based bumps (e.g., C2 interconnections). The EMIB and the 3D stacked architecture may also be combined using an omni-directional interconnect (ODI), which allows for top-packaged chips to communicate with other chips horizontally using EMIB and vertically, using Through-Mold Vias (TMVs) which are typically larger than TSVs. However, many of these current interconnect technologies use solder or its equivalent for connectivity, with consequent low vertical and horizontal interconnect density.

One way to mitigate low vertical interconnect density is to use an interposer, which improves vertical interconnect density but suffers from low lateral interconnect density if the base wafer of the interposer is passive. In a general sense, an "interposer" is commonly used to refer to a base piece of silicon that interconnects two dies. By including active circuitry in the interposer, lateral speeds may be improved, but it requires more expensive manufacturing processes, in particular when a large base die is used to interconnect smaller dies. Additionally, not all interfaces require fine pitch connections which may lead to additional manufacturing and processing overheads without the benefits of the fine pitch.

In general, many methods exist that enable heterogeneous integration of ICs made by different manufacturing technologies by using die-to-die, die-to-wafer as well as wafer-to-wafer hybrid bonding. At the die-to-die, die-to-wafer as well as wafer-to-wafer interfaces, in addition to interconnects, it is common to find passive devices such as capacitors and inductors. In most cases, these passive layers enable only pass-through-connections and/or fan-out. The absence of active devices such as transistors in these interface layers requires that many circuit functionalities such as re-clocking, repair, repeaters, voltage control, electrostatic discharge (ESD) protection ESD, etc., must be fabricated and performed on the die. Because many of these functionalities are commonly employed in different dies, there is needless repetition of such common functionalities from die to die in an integrated design, wasting prime on-die real estate and design resources.

In one aspect of the present disclosure, methods and structures are disclosed that allow integration of an ADL at the die-to-die and/or die-to-package interfaces, thus enabling a host of functionalities to be implemented at these common interfaces. As used herein, "interface" refers to a three-dimensional region located around and/or proximate to a boundary where two coupled components, surfaces, and/or materials meet and affect each other.

Each of the structures, assemblies, packages, methods, devices, and systems of the present disclosure may have several innovative aspects, no single one of which is solely responsible for all the desirable attributes disclosed herein. Details of one or more implementations of the subject matter described in this specification are set forth in the description below and the accompanying drawings.

In the following detailed description, various aspects of the illustrative implementations may be described using terms commonly employed by those skilled in the art to convey the substance of their work to others skilled in the art. For example, the term "connected" means a direct connection (which may be one or more of a mechanical, electrical, and/or thermal connection) between the things that are connected, without any intermediary devices, while the term "coupled" means either a direct connection between the things that are connected, or an indirect connection through one or more passive or active intermediary devices. The term "circuit" means one or more passive and/or active components that are arranged to cooperate with one another to provide a desired function. The term "interconnect" may be used to describe any element formed of an electrically conductive material for providing electrical connectivity to one or more components associated with an IC or/and between various such components. In general, the "interconnect" may refer to both conductive traces (also sometimes referred to as "lines") and conductive vias. In general, in context of interconnects, the term "conductive trace" may be used to describe an electrically conductive element isolated by an insulator material (e.g., a low-k dielectric material) that is provided within the plane of an IC die. Such traces are typically stacked into several levels, or several layers, of metallization stacks. On the other hand, the term "via" may be used to describe an electrically conductive element that interconnects two or more traces of different levels. To that end, a via may be provided substantially perpendicularly to the plane of an IC die and may interconnect two traces in adjacent levels or two traces in not adjacent levels. A term "metallization stack" may be used to refer to a stack of one or more interconnects for providing connectivity to different circuit components of an IC chip. Sometimes, traces and vias may be referred to as "conductive traces" and "conductive vias", respectively, to highlight the fact that these elements include electrically conductive materials such as metals.

Interconnects as described herein, in particular interconnects of the IC structures as described herein, may be used for providing electrical connectivity to one or more components associated with an IC or/and between various such components, where, in various embodiments, components associated with an IC may include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in a computer. In another example, the terms "package" and "IC package" are synonymous, as are the terms "die" and "IC die," the term "insulating" means "electrically insulating," the term "conducting" means "electrically conducting," unless otherwise specified.

In yet another example, if used, the terms "oxide," "carbide," "nitride," etc. refer to compounds containing, respectively, oxygen, carbon, nitrogen, etc., the term "high-k dielectric" refers to a material having a higher dielectric constant than silicon oxide, while the term "low-k dielectric" refers to a material having a lower dielectric constant than silicon oxide.

The terms "substantially," "close," "approximately," "near," and "about," generally refer to being within +/−20% of a target value (e.g., within +/−5 or 10% of a target value) based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with one or both of the two layers or may have one or more intervening layers. In contrast, a first layer described to be "on" a second layer refers to a layer that is in direct contact with that second layer. Similarly, unless explicitly stated otherwise, one feature disposed between two features may be in direct contact with the adjacent features or may have one or more intervening layers. In addition, the term "dispose" as used herein refers to position, location, placement, and/or arrangement rather than to any particular method of formation.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. When used herein, the notation "A/B/C" means (A), (B), and/or (C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense.

In the drawings, same reference numerals refer to the same or analogous elements/materials shown so that, unless stated otherwise, explanations of an element/material with a given reference numeral provided in context of one of the drawings are applicable to other drawings where element/materials with the same reference numerals may be illustrated. Furthermore, in the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using, e.g., images of suitable characterization tools such as scanning electron microscopy (SEM) images, transmission electron microscope (TEM) images, or non-contact profilometer. In such images of real structures, possible processing and/or surface defects could also be visible, e.g., surface roughness, curvature or profile deviation, pit or scratches, not-perfectly straight edges of materials, tapered vias or other openings, inadvertent rounding of corners or variations in thicknesses of different material layers, occasional screw, edge, or combination dislocations within the crystalline region(s), and/or occasional dislocation defects of single atoms or clusters of atoms. There may be other defects not listed here but that are common within the field of device fabrication and/or packaging.

In the drawings, a particular number and arrangement of structures and components are presented for illustrative purposes and any desired number or arrangement of such structures and components may be present in various embodiments. Further, the structures shown in the figures may take any suitable form or shape according to material properties, fabrication processes, and operating conditions.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

Example Embodiments

FIG. 1 is a schematic cross-sectional view of a die assembly 100 with ADLs according to some embodiments of the present disclosure. Die assembly 100 comprises at least two component layers 102 and 104, stacked one over another with at least one of the two component layers 102 and 104 comprising at least one die. For example, in the embodiment shown, component layer 102 comprises die 106, and component layer 104 comprises dies 108. In other embodiments, component layer 102 may not comprise any dies, whereas component layer 104 may comprise at least one die; in yet other embodiments, component layer 102 may comprise at least one die whereas component layer 104 may not comprise any dies; in yet other embodiments, component layers 102 and 104 may each comprise a plurality of dies. Die 106 may be configured to be coupled to dies 108 with die-to-die (DTD) interconnects in some embodiments. In various embodiments, die 106 in bottom component layer 102 may have TSVs 110 (e.g., as shown). In other embodiments, die 106 may not have TSVs 110. In various embodiments, each component layers 102 and 104 may comprise an insulator 112 between and surrounding the respective dies. Through-connections (e.g., TMVs) 114 in insulator 112 may provide electrical coupling through the corresponding layer.

Die assembly 100 may comprise an IC, such as a microprocessor, in some embodiments. In other embodiments, die assembly 100 may form a portion (e.g., system controller block) of a larger IC, such as a microprocessor, a central processing unit (CPU), a memory device, e.g., a high bandwidth memory device, a logic circuit, input/output circuitry, a transceiver such as a field programmable gate array transceiver, a gate array logic such as a field programmable gate array logic, of a power delivery circuitry, a III-V or a III-N device such as a III-N or III-N amplifier (e.g., gallium nitride (GaN) amplifier), Peripheral Component Interconnect Express circuitry, Double Data Rate transfer circuitry, or other electronic components known in the art.

In some embodiments, insulator 112 may include a dielectric material, such as silicon dioxide, silicon nitride, oxynitride, polyimide materials, glass reinforced epoxy matrix materials, organic materials such as silica filled epoxy, or a low-k or ultra-low-k dielectric (e.g., carbon-doped dielectrics, fluorine-doped dielectrics, porous dielectrics, organic polymeric dielectrics, photo-imageable dielectrics, and/or benzocyclobutene-based polymers). In some embodiments insulator 112 may include a semiconductor material, such as silicon, germanium, or a III-V material (e.g., gallium nitride), and one or more additional materials.

In an example embodiment one or more dies 106 and 108 comprise a metallization stack with a plurality of metal layers through insulator fabricated using known semiconductor manufacturing processes. In some embodiments, one or more dies 106 and 108 may comprise a substrate including substantially monocrystalline semiconductors, such as silicon or germanium. In some other embodiments, the substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V, group II-VI, or group IV materials. In yet other embodiments, the substrate may comprise compound semiconductors, for example, with a first sub-lattice of at least one element from group III of the periodic table (e.g., Al, Ga, In), and a second sub-lattice of at least one element of group V of the periodic table (e.g., P, As, Sb). In yet other embodiments, the substrate may comprise an intrinsic IV or III-V semiconductor material or alloy, not intentionally doped with any electrically active impurity; in alternate embodiments, nominal impurity dopant levels may be present. In other embodiments, the substrate may comprise high mobility oxide semiconductor material, such as tin oxide, antimony oxide, indium oxide, indium tin oxide, titanium oxide, zinc oxide, indium zinc oxide, indium gallium zinc oxide (IGZO), gallium oxide, titanium oxy-nitride, ruthenium oxide, or tungsten oxide. In general, the substrate may include one or more of tin oxide, cobalt oxide, copper oxide, antimony oxide, ruthenium oxide, tungsten oxide, zinc oxide, gallium oxide, titanium oxide, indium oxide, titanium oxy-nitride, indium tin oxide, indium zinc oxide, nickel oxide, niobium oxide, copper peroxide, IGZO, indium telluride, molybdenite, molybdenum diselenide, tungsten diselenide, tungsten disulfide, N- or P-type amorphous or polycrystalline silicon, germanium, indium gallium arsenide, silicon-germanium, gallium nitride, aluminum gallium nitride, indium phosphide, and black phosphorus, each of which may possibly be doped with one or more of gallium, indium, aluminum, fluorine, boron, phosphorus, arsenic, nitrogen, tantalum, tungsten, and magnesium, etc.

Die assembly 100 as shown comprises a plurality of interfaces 120, for example, interface 120(1) proximate to one surface of component layer 102 and interface 120(2) proximate to an opposing surface of component layer 102. In various embodiments, interfaces 120 may comprise an ADL 122 and a bonding layer 124. For example, interface 120(1) comprises ADL 122(1) and bonding layer 124(1); interface 120(2) comprises ADL 122(2) and bonding layer 124(2). In some embodiments, bonding layer 124 may couple ADL 122 to the component layer directly over interface 120 (e.g., as shown). For example, bonding layer 124(1) couples ADL 122(1) to component layer 102, and bonding layer 124(2) couples ADL 122(2) to component layer 104. In other embodiments, bonding layer 124 may couple ADL 122 to the component layer directly under interface 120; in yet other embodiments, bonding layer 124 may couple ADL 122 to component layers on either side of interface layer 120.

ADL 122 may comprise active elements (e.g., transistors and diodes) disposed in a suitable semiconductor or equivalent material, with one or more layers of conductive metal traces in dielectric between the active elements to form appropriate circuits therein. As used herein, the term "active element" refers to any circuit component that can enhance the energy level of a signal passing through it; the active element can control and/or amplify the flow of electric current through a circuit, as opposed to a passive element that merely consumes and/or stores electrical power and/or scales down the amount of current flow. Examples of active elements include transistors and diodes. Bonding layer 124 may comprise conductive through-connections 126 in an insulator 128. Through-connections 126 may enable electrical connectivity to the active elements and/or circuitry of ADL 122. Insulator 128 may be any suitable insulating material, such as organic thin-film polymers or inorganic materials, such as oxides and/or nitrides of silicon, for example, silicon oxide, silicon oxy-nitride, silicon nitride, silicon carbon nitride, and/or any multi-layer combinations of silicon oxide, silicon oxy-nitride, silicon nitride, and silicon carbon nitride.

In some embodiments (e.g., as shown) interface 120(1) under component layer 102 may be coupled to conductive bond pads 130 (and/or redistribution metallization) in an insulator 132 (e.g., organic insulator such as polyimide or solder resist), for example, to enable coupling to another element, such as a package substrate, with DTD interconnects or die-to-package substrate (DTPS) interconnects. In other embodiments, interface 120(1) under component layer 102 may be coupled to other types of interconnection structures.

Although not specifically shown in the illustration in order to not clutter, any interface 120 described herein includes two surfaces: a first surface proximate to a second surface. When DTD or DTPS interconnects are described at the interface, the first surface may include a first set of conductive contacts, and the second surface may include a second set of conductive contacts that are configured to be electrically coupled to the first set of conductive contacts. One or more conductive contacts of the first set may then be electrically and mechanically coupled to some of the conductive contacts of the second set by the DTD or DTPS interconnects.

The DTPS interconnects disclosed herein may take any suitable form. In some embodiments, the DTPS interconnects may include solder (e.g., solder bumps or balls that are subject to a thermal reflow to form the DTPS interconnects). The solder material may include lead/tin, tin/bismuth, eutectic tin/silver, ternary tin/silver/copper, eutectic tin/copper, tin/nickel/copper, tin/bismuth/copper, tin/indium/copper, tin/zinc/indium/bismuth, or other alloys. In some embodiments, the DTPS interconnects may include an anisotropic conductive material, such as an anisotropic conductive film or an anisotropic conductive paste. An anisotropic conductive material may include conductive materials dispersed in a non-conductive material. In some embodiments, an anisotropic conductive material may include microscopic conductive particles embedded in a binder or a thermoset adhesive film (e.g., a thermoset biphenyl-type epoxy resin, or an acrylic-based material). In some embodiments, the conductive particles may include a polymer and/or one or more metals (e.g., nickel or gold). For example, the conductive particles may include nickel-coated gold or silver-coated copper that is in turn coated with a polymer. In another example, the conductive particles may include nickel. When an anisotropic conductive material is uncompressed, there may be no conductive pathway from one side of the material to the other. However, when the anisotropic conductive material is adequately compressed (e.g., by conductive contacts on either side of the anisotropic conductive material), the conductive materials near the region of compression may contact each other so as to form a conductive pathway from one side of the film to the other in the region of compression.

The DTD interconnects disclosed herein may take any suitable form. In some embodiments, the DTD interconnects may be hybrid bond interconnects, comprising metal-to-metal interconnects (e.g., copper-to-copper interconnects, or plated interconnects). In such embodiments, the conductive contacts on either side of the DTD interconnect may be bonded together (e.g., under elevated pressure and/or temperature) without the use of intervening solder or an anisotropic conductive material. In some embodiments, a thin cap of solder may be used in a metal-to-metal interconnect to accommodate planarity, and this solder may become an intermetallic compound during processing. In some metal-to-metal interconnects that utilize hybrid bonding, a dielectric material (e.g., silicon oxide, silicon nitride, silicon carbide, or an organic layer) may be present between the metals bonded together (e.g., between copper pads or posts that provide the associated conductive contacts). In some embodiments, one side of a DTD interconnect may include a metal pillar (e.g., a copper pillar), and the other side of the DTD interconnect may include a metal contact (e.g., a copper contact) recessed in a dielectric. In some embodiments, a metal-to-metal interconnect (e.g., a copper-to-copper interconnect) may include a noble metal (e.g., gold) or a metal whose oxides are conductive (e.g., silver). In some embodiments, a metal-to-metal interconnect may include metal nanostructures (e.g., nanorods) that may have a reduced melting point. Metal-to-metal interconnects may be capable of reliably conducting a higher current than other types of interconnects; for example, some solder interconnects may form brittle intermetallic compounds when current flows, and the maximum current provided through such interconnects may be constrained to mitigate mechanical failure.

In some embodiments, the dies on either side of a set of DTD interconnects may be unpackaged dies, and/or the DTD interconnects may include small conductive bumps or pillars (e.g., copper bumps or pillars) attached to the respective conductive contacts by solder. In some embodiments, some or all of the DTD interconnects may be solder interconnects that include a solder with a higher melting point than a solder included in some or all of the DTPS interconnects. For example, when the DTD interconnects are formed before the DTPS interconnects are formed, solder-based DTD interconnects may use a higher-temperature solder (e.g., with a melting point above 200 degrees Celsius), while the DTPS interconnects may use a lower-temperature solder (e.g., with a melting point below 200 degrees Celsius). In some embodiments, a higher-temperature solder may include tin; tin and gold; or tin, silver, and copper (e.g., 96.5% tin, 3% silver, and 0.5% copper). In some embodiments, a lower-temperature solder may include tin and bismuth (e.g., eutectic tin bismuth) or tin, silver, and bismuth. In some embodiments, a lower-temperature solder may include indium, indium and tin, or gallium.

In some embodiments, the DTD interconnects may include any appropriate solder material, such as any of the materials discussed above for the DTPS interconnects. In some embodiments, the DTD interconnects may include an anisotropic conductive material, such as any of the materials discussed above for the DTPS interconnects. In some embodiments, the DTD interconnects may be used as data transfer lanes, while the DTPS interconnects may be used for power and ground lines, among others.

In some embodiments, the pitch of the DTD interconnects may be different from the pitch of the DTPS interconnects, although, in other embodiments, these pitches may be substantially the same. In packages as described herein, some or all of the DTD interconnects may have a finer pitch than the DTPS interconnects. In some embodiments, the DTPS interconnects disclosed herein may have a pitch between about 80 micrometer and 300 micrometer, while the DTD interconnects disclosed herein may have a pitch between about 0.7 micrometer and 100 micrometer. In various embodiments, the pitch of hybrid bond interconnects may be less than 10 micrometer. In some embodiments, the pitch of interconnects comprising micro-bumps (e.g., C2 bumps) may be between 10 micrometer and 50 micrometer; in other embodiments, the pitch of interconnects comprising fine pitch flip-chip interconnects (e.g., C4 bumps) may be between 20 micrometer and 100 micrometer.

In some embodiments, the DTD interconnects may have too fine a pitch to couple to the package substrate directly (e.g., too fine to serve as DTPS interconnects). The DTD interconnects may have a smaller pitch than the DTPS interconnects due to the greater similarity of materials in the different dies on either side of a set of DTD interconnects than between a die and a package substrate on either side of a set of DTPS interconnects. In particular, the differences in the material composition of ICs and package substrates may result in differential expansion and contraction of the ICs and package substrates due to heat generated during operation (as well as the heat applied during various manufacturing operations). To mitigate damage caused by this differential expansion and contraction (e.g., cracking, solder bridging, etc.), the DTPS interconnects in any of the packages as described herein may be formed larger and farther apart than DTD interconnects, which may experience less thermal stress due to the greater material similarity of the pair of dies on either side of the DTD interconnects.

In various embodiments, common functions and devices may be disaggregated from dies 106 and 108 to ADL 122, for example, to improve area utilization on the dies and optimize total cost. Shared functionalities or components (e.g., analog repeaters), can be implemented more efficiently at interface 120, for example, in ADL 122. Some devices (e.g. ESD diodes) are more suitably implemented in ADL 122 at interface 120 than in dies manufactured using leading node complementary metal-oxide-semiconductor (CMOS) processes. Other advantages include enabling more advanced DTD interconnectivity and enabling larger-than-die fan-out, for example, with active devices spread over a larger area in die assembly 100 than is possible with individual dies 106 and/or 108. Further, dies 106 and 108 may be manufactured using different process nodes, yet seamlessly integrated with ADL 122.

Note that FIG. 1 is intended to show relative arrangements of the components within their assemblies, and that, in general, such assemblies may include other components that are not illustrated (e.g., various interfacial layers or various other components related to optical functionality, electrical connectivity, and/or thermal mitigation). For example, in some further embodiments, the assembly as shown in FIG. 1 may include multiple dies and/or processing units (XPUs) along with other electrical components.

Additionally, although some components of the assemblies are illustrated in FIG. 1 as being planar rectangles or formed of rectangular solids, this is simply for ease of illustration, and embodiments of these assemblies may be curved, rounded, or otherwise irregularly shaped as dictated by and sometimes inevitable due to the manufacturing processes used to fabricate various components.

In various embodiments, any of the features discussed with reference to FIG. 1 herein may be combined with any other features to form a package with one or more ICs as described herein, for example, to form a modified die assembly 100. Some such combinations are described above, but, in various embodiments, further combinations and modifications are possible.

Example Methods

FIGS. 2A-2I are schematic cross-sectional illustrations of various stages of manufacture of die assembly 100, according to some embodiments of the present disclosure. Assembly 200 comprises a carrier wafer 202, for example, made of silicon, on which ADL 122(1) may be formed suitably, for example, using known semiconductor manufacturing methods for forming active elements (e.g., transistors and diodes). In some embodiments, a metallization stack comprising one or more layers of conductive traces and vias in a suitable dielectric may also be formed on the active elements to generate suitable active circuits. The process for fabricating ADL 122(1) is described in further detail in FIGS. 3A-3J.

Figure 2A:
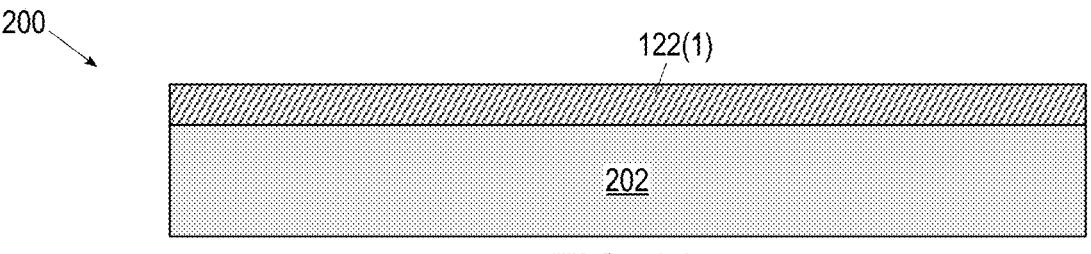
FIGS. 2A-2I are schematic cross-sectional views of various stages of manufacture of an example die assembly with ADLs, according to some embodiments of the present disclosure.
Figure 2B:
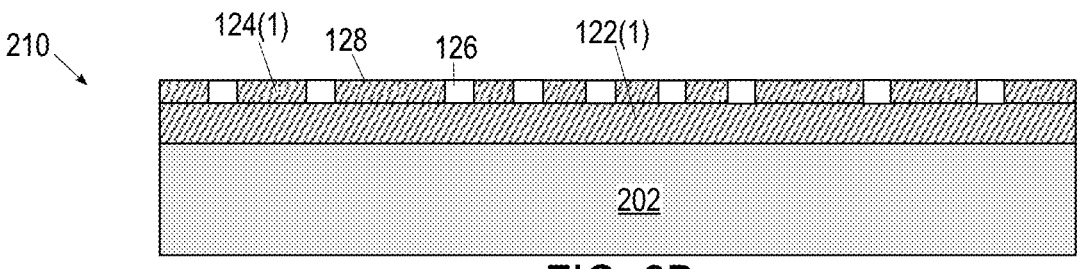

FIG. 2B is a schematic cross-sectional illustration of assembly 210 subsequent to disposing bonding layer 124(1) thereon. For example, insulator 128 may be deposited on ADL 122, and appropriate through-connections 126 formed therein to enable electrical connectivity to ADL 122. In an example process, insulator 128 may be dispensed in liquid form and then cured appropriately (e.g., using heat and/or ultraviolet radiation). In another example process, insulator 128 may be deposited using physical vapor deposition (PVD). Any suitable process for the material of the insulator may be used within the broad scope of the embodiments.

Figure 2C:
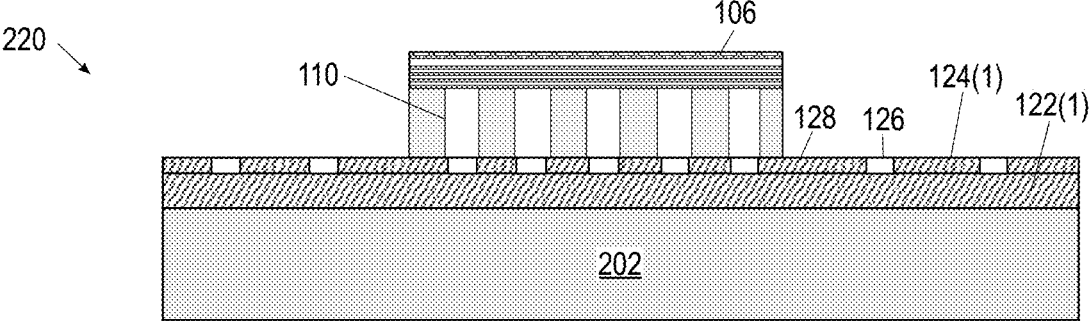

FIG. 2C is a schematic cross-sectional illustration of assembly 220 subsequent to coupling die 106 thereon. In various embodiments, die 106 may comprise TSVs 110 manufactured using any suitable semiconductor manufacturing process, termed IC technology 1 for purposes of description herein.

Figure 2D:
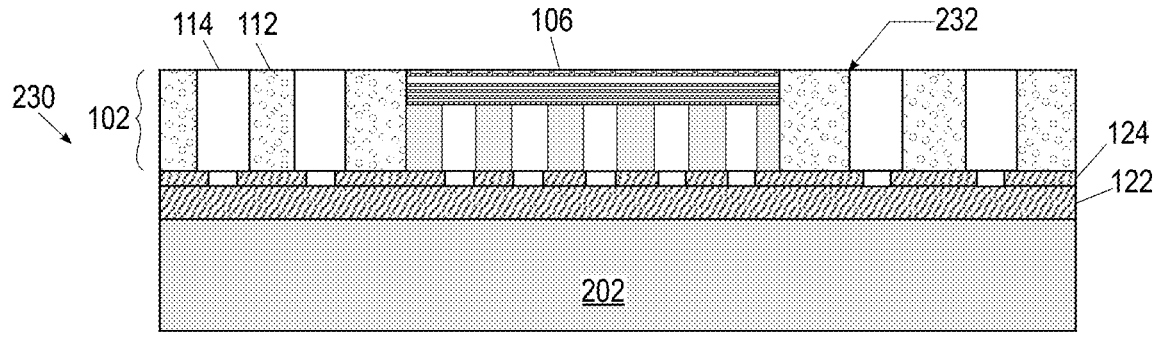

FIG. 2D is a schematic cross-sectional illustration of assembly 230 subsequent to disposing insulator 112 over bonding layer 124(1) and around die 106. In an example process, insulator 112 may be dispensed in liquid form and then cured appropriately (e.g., using heat and/or ultraviolet radiation). Any suitable process may be used to dispose insulator 112. Through-connections (e.g., TMVs) 114 may be formed in insulator 112, for example, by selecting etching, laser forming, etc. and then plating with metal to complete component layer 102. In some embodiments, TMVs 114 may function as ODI interconnects. In such embodiments, TMVs 114 may be formed first, for example, as copper "pillars" over bonding layer 124(1). Insulator 112 may be disposed around these pillars and die 106 and cured appropriately. Surface 232 of component layer 102 may be substantially planarized using a suitable process, such as chemical mechanical polishing (CMP).

Figure 2E:
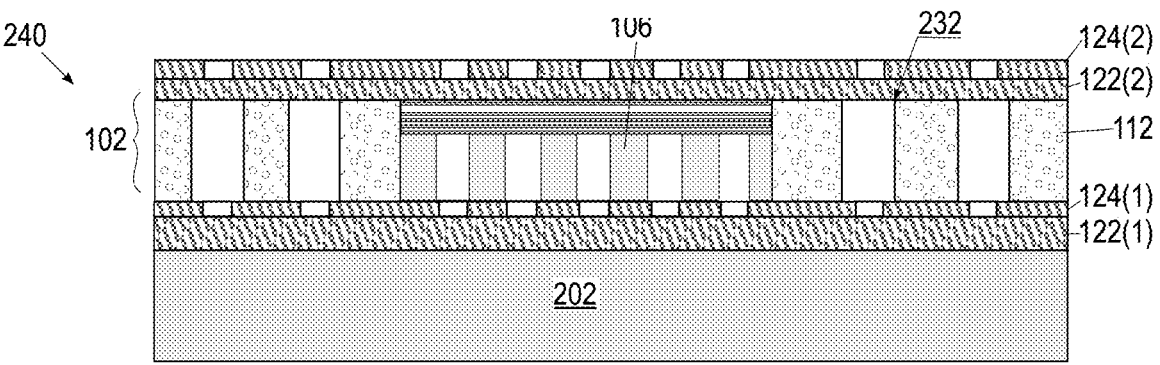

FIG. 2E is a schematic cross-sectional illustration of assembly 240 subsequent to forming ADL 122(2) and bonding layer 124(2) over surface 232 of component layer 102. Details of fabrication of ADL 122(2) and bonding layer 124(2) over component layer 102 are provided with respect to FIGS. 3A-3I and 3K-3L.

Figure 2F:
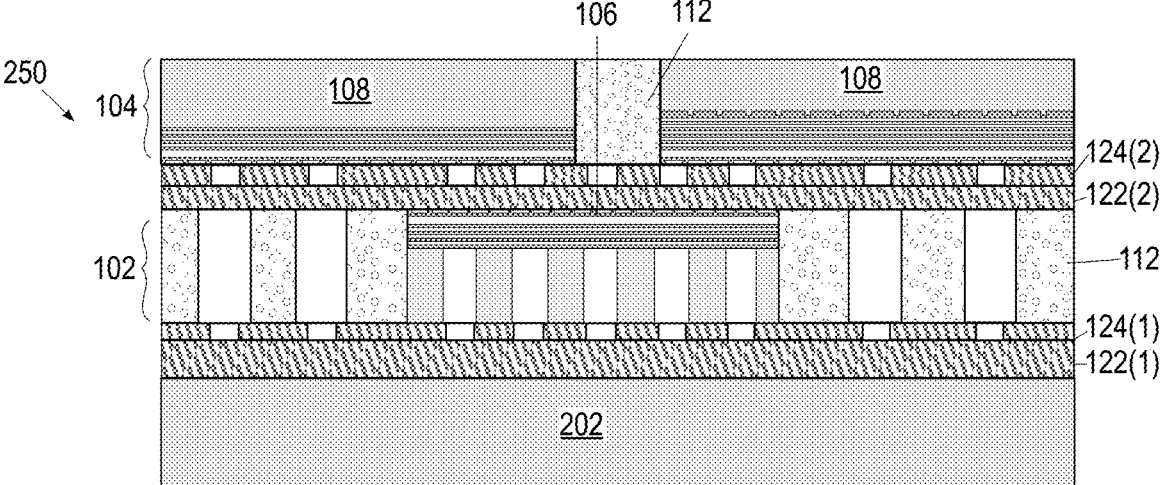

FIG. 2F is a schematic cross-sectional illustration of assembly 250 subsequent to forming component layer 104 over bonding layer 124(2). Dies 108 may be coupled to bonding layer 124(2) using suitable interconnection means (e.g., DTD bonds such as hybrid bond interconnects) in a die-to-wafer bonding process. In various embodiments, dies 108 may be manufactured using processing technologies termed IC technology 2, 3, that is/are different from IC technology 1 used to fabricate die 106. Insulator 112 may be deposited around dies 108 to complete component layer 104.

Figure 2G:
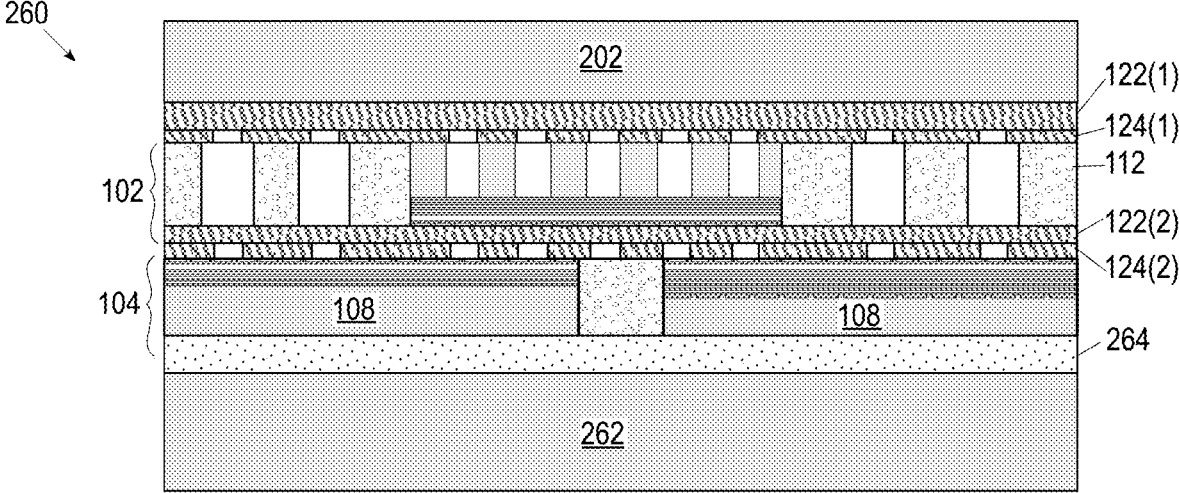

FIG. 2G is a schematic cross-sectional illustration of assembly 260 subsequent to attaching to carrier wafer 262. Assembly 250 may be turned over, and component layer 104 bonded to carrier wafer 262 with adhesive 264.

Figure 2H:
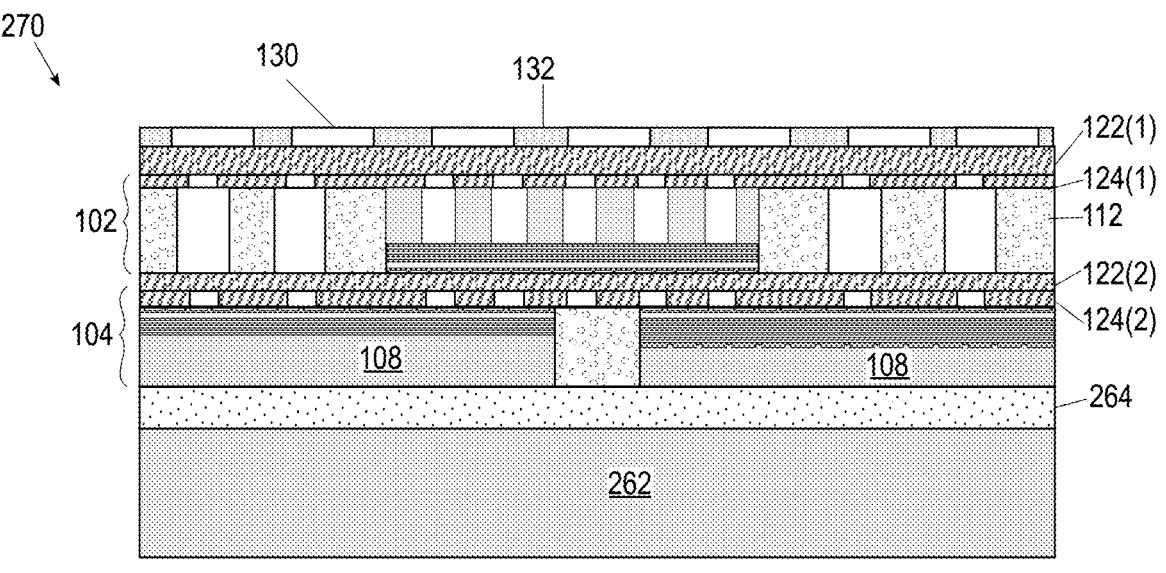

FIG. 2H is a schematic cross-sectional illustration of assembly 270 subsequent to further processing, for example, backside removal, planarization, patterning, and bumping. Carrier wafer 202 may be de-bonded from ADL 122(1). Insulator 132 may be dispensed on ADL 122(1). Bond pads 130 may be disposed therein. Any suitable packaging processing may be used to fabricate insulator 132 and form bond pads 130 therein. In some embodiments, insulator 132 may planarized before patterning bond pads 130. In some embodiments, solder balls (e.g., flip-chip solder balls) may be attached to bond pads 130 in a bumping process.

Figure 2I:
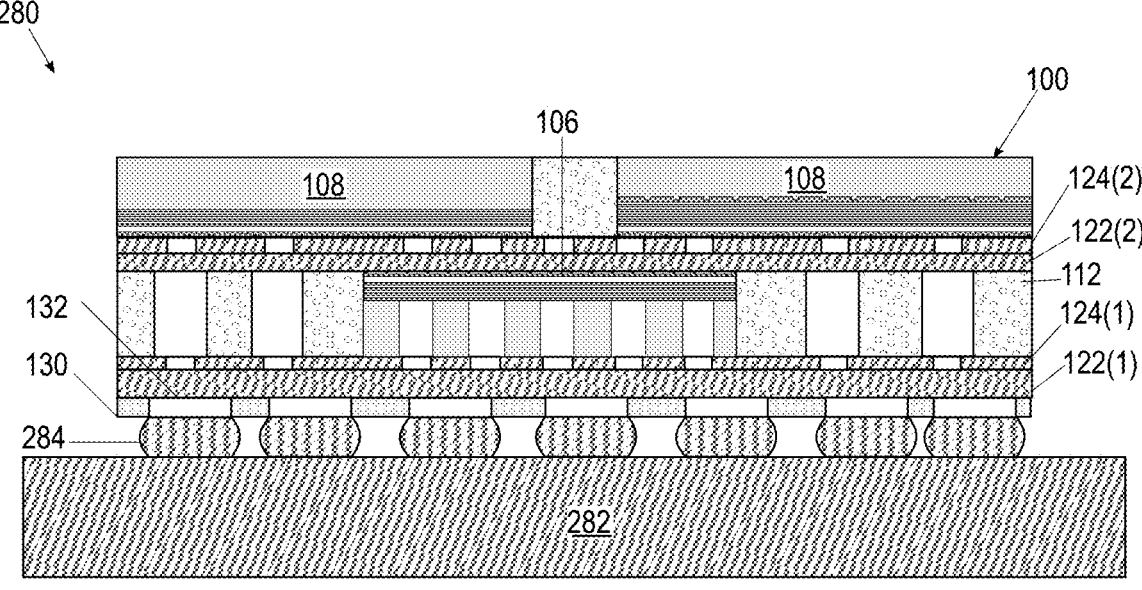

FIG. 2I is a schematic cross-sectional illustration of assembly 280 subsequent to further processing. Assembly 270 may be singulated into individual die assemblies 100 and de-bonded from carrier wafer 262. Individual die assembly 100 may be coupled to a package support 282 with interconnects 284. In some embodiments, package support 282 may comprise an interposer with semiconductor bridge dies therein and interconnects 284 may comprise DTD interconnects of suitable pitch. In other embodiments, package support 282 may comprise a package substrate and interconnects 284 may comprise DTPS interconnects. In yet other embodiments, package support 282 may comprise a printed circuit board (PCB) and interconnects 284 may comprise DTPS interconnects of suitable pitch.

Figure 3A:
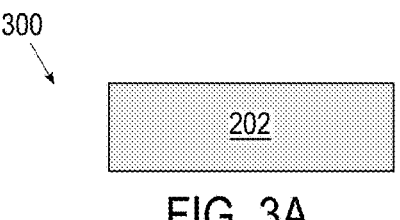
FIGS. 3A-3L are schematic cross-sectional views of various stages of manufacture of an example die assembly with ADLs, according to some embodiments of the present disclosure.

FIGS. 3A-3J are schematic cross-sectional illustrations of various stages of manufacture of ADL 122 according to various embodiments. FIG. 3A shows an assembly 300 comprising carrier wafer 202. In some embodiments, carrier wafer 202 may be comprised of silicon or some other suitable semiconductor substrate that can be used to form active elements therein. In other embodiments, carrier wafer 202 may be any other material that can provide mechanical rigidity to support the structures formed during the manufacturing processes.

Figure 3B:
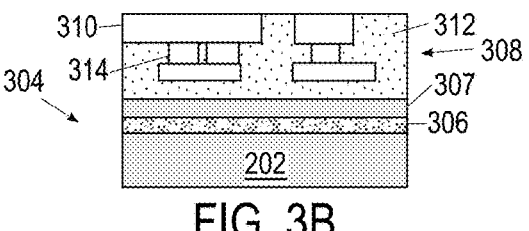

FIG. 3B shows a schematic cross-sectional illustration of assembly 304 subsequent to forming a sacrificial stop layer 306 on carrier wafer 202. Sacrificial stop layer 306 may be an oxide (e.g., silicon dioxide $SiO_2$) or a semiconductor layer such as silicon-germanium ($Si_{1-x}Ge_x$, x=0 to 30%). In various embodiments, sacrificial stop layer 306 can be any suitable material that has a composition different from silicon, and that can be used to de-bond or cleave carrier wafer 202 at a later processing stage. In various embodiments, a thickness of sacrificial stop layer 306 may be approximately 10 nm to 1 micrometer. In some embodiments, sacrificial stop layer 306 may be grown by epitaxy over the surface of carrier wafer 202. In some embodiments, a thin substrate layer 307 of silicon or suitable material that can be used to deposit interlayer dielectrics (ILD) thereon may be grown by epitaxy over sacrificial stop layer 306. In other embodiments, carrier wafer 202 may be comprised of silicon formed with a buried oxide layer therein, which functions as sacrificial stop layer 306, and the layer over it forms the thin substrate layer 307.

In various embodiments, bottom interconnect layer 308 of ADL 122 may be formed over sacrificial stop layer 306 and substrate layer 307. Bottom interconnect layer 308 comprises conductive metal traces 310 deposited and patterned suitably in ILD 312, with vias 314 as appropriate. ILD 312 may comprise carbon-infused silicon oxide (e.g., $SiO_2$). In various embodiments, conductive metal traces 310 and vias 314 comprise conductive materials such as tungsten, molybdenum, and/or ruthenium that can withstand subsequent high temperature processes.

Figure 3C:
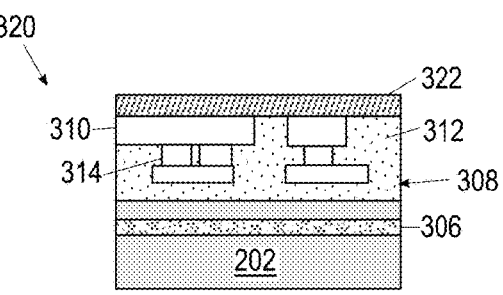

FIG. 3C shows a schematic cross-sectional illustration of assembly 320 subsequent to forming bonding oxide (BOX) 322 over bottom interconnect layer 308. BOX 322 may comprise silicon oxide (SiO$_2$) in some embodiments; in other embodiments, BOX 322 may comprise silicon oxynitride (SiO$_x$N$_y$). In various embodiments, BOX 322 may be deposited (e.g., by PVD) and planarized subsequently.

Figure 3D:
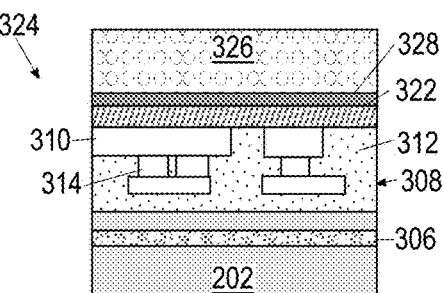

FIG. 3D shows a schematic cross-sectional illustration of assembly 324 subsequent to bonding a donor wafer 326 comprising a seed layer 328 over BOX 322. In some embodiments, a boundary of seed layer 328 may comprise a thin layer of substrate material (e.g., silicon) infused with hydrogen that can enable cleaving of seed layer 328 at high temperature, for example between 200 degrees Celsius and 1000 degrees Celsius for a corresponding duration of time (e.g., 400 degrees Celsius for 4 minutes), for example, because the hydrogen creates a weakness in the substrate's crystal lattice. Heating at a lower temperature may require a longer duration of time to cleave than heating at a higher temperature.

Figure 3E:
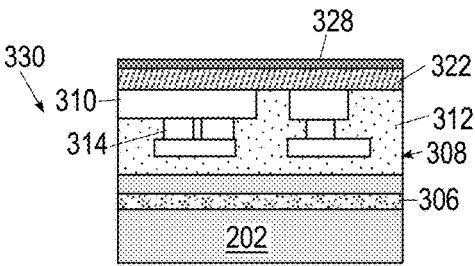

FIG. 3E shows a schematic cross-sectional illustration of assembly 330 subsequent to cleaving donor wafer 326, leaving behind seed layer 328 on BOX 322.

Figure 3F:
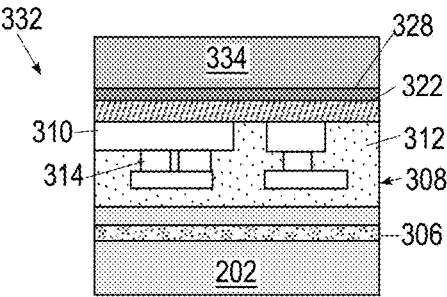

FIG. 3F shows a schematic cross-sectional illustration of assembly 332 subsequent to growing a substrate layer 334 comprising gallium and nitrogen (e.g., gallium nitride GaN) on seed layer 328, for example, by epitaxy. Other suitable materials for substrate layer 334 comprise III-V technology materials such as indium phosphide (InP), gallium arsenide (GaAs), indium gallium arsenide (InGaAs), indium aluminum arsenide (InAlAs), indium gallium phosphide (InGaP), etc., or silicon-on-insulator technology materials. These materials may provide a suitable N-MOS material with wide bandgap and radio frequency (RF)/analog capabilities.

Figure 3G:
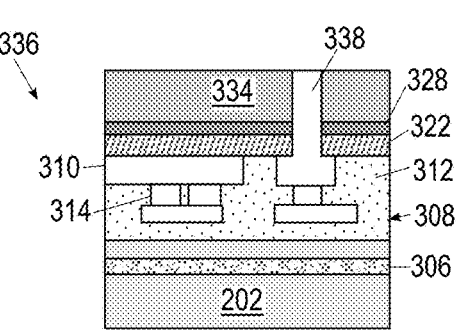

FIG. 3G shows a schematic cross-sectional illustration of assembly 336 subsequent to forming TSV 338 through-substrate layer 334. In some embodiments, TSV 338 may be formed by deep etching trenches, then filling the trenches with conductive metal.

Figure 3H:
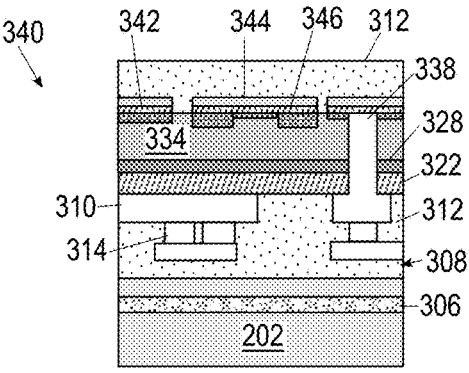

FIG. 3H shows a schematic cross-sectional illustration of assembly 340 subsequent to further processing. A buffer layer 342, followed by a silicon channel layer 344 may be formed over the gallium nitride substrate layer 334 to form active elements 346, comprising, for example, source-drain-gate structures. In some embodiments, buffer layer 342 and silicon channel layer 344 may be optional, depending on the underlying material of substrate layer 334. For example, if substrate layer 334 is silicon, buffer layer 342 and silicon channel layer 344 may be absent. ILD 312 may be deposited thereon. In various embodiments, multiple layer transfers may be performed, for example, to enable higher (e.g., more complex) levels of integration of different transistor technologies that enable multiple functionalities and value-add. Although integration of gallium nitride and silicon CMOS transistor technology is shown in the illustrations herein, any suitable semiconductor technology may be used to fabricate active elements 346 in ADL 122.

Figures 3I, 3J, 3K, 3L:
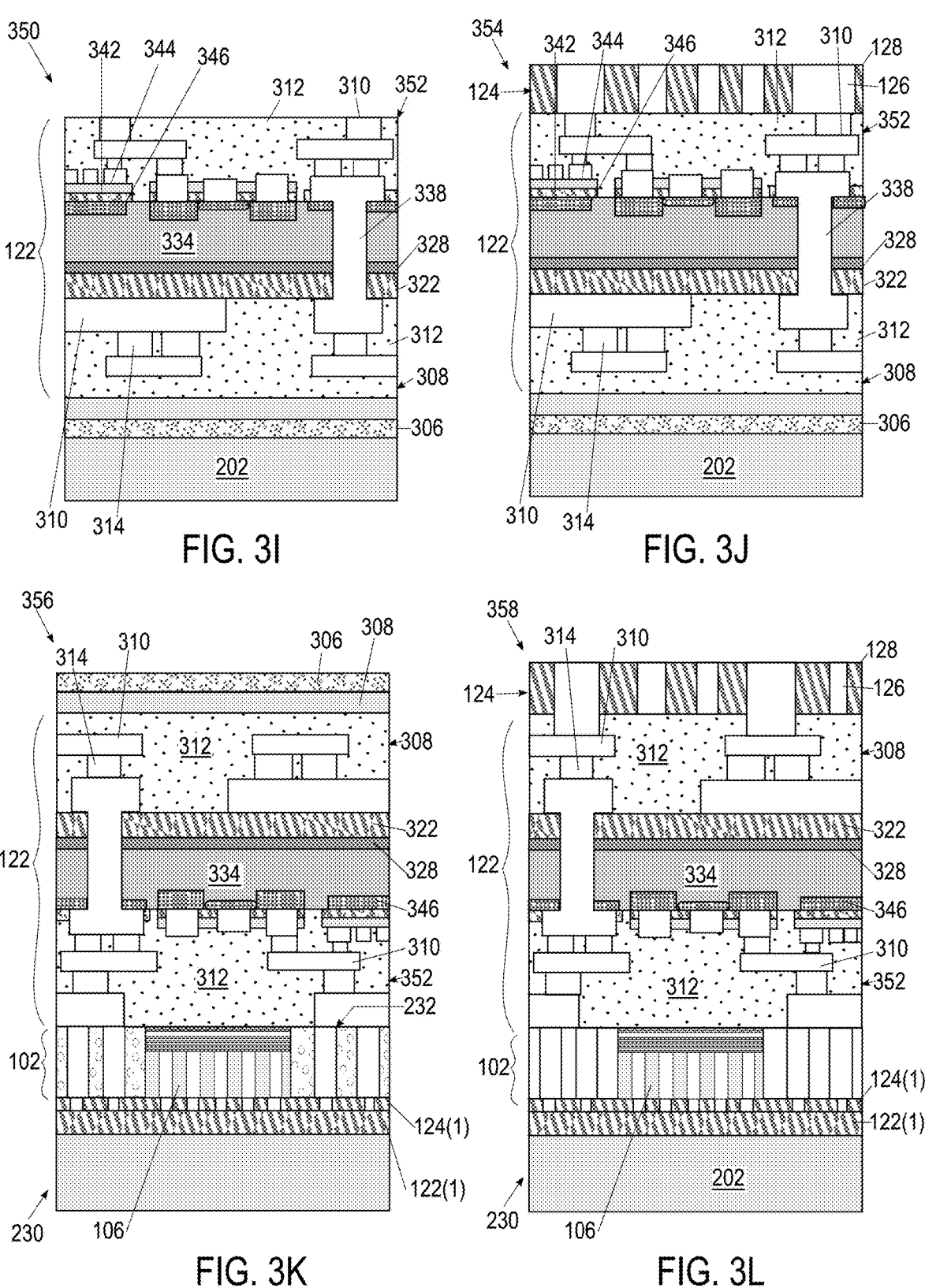

FIG. 3I shows a schematic cross-sectional illustration of assembly 350 subsequent to forming conductive metal traces 310 and vias in ILD 312 to form a top interconnect layer 352, substantially completing formation of ADL 122.

FIG. 3J shows a schematic cross-sectional illustration of assembly 354 subsequent to forming bonding layer 124 over top interconnects layer 352 of ADL 122. In some embodiments, bonding layer 124 may comprise low resistivity metals (e.g., copper, aluminum) in through-connections 126 and ILD as insulator 128, for example, to enable planarization and provide mechanical strength. The process may continue further by attaching die 106, as indicated in FIG. 2C.

FIG. 3K shows a schematic cross-sectional illustration of assembly 356, which comprises assembly 350 subsequent to further processing. As described with respect to FIG. 3I, assembly 350 illustrates a substantially complete ADL 122. Assembly 350 may then be flipped and top interconnect layer 352 bonded to surface 232 of assembly 230 of FIG. 2D. In various embodiments, the bonding may comprise hybrid bond interconnecting. As described with respect to FIG. 2D, assembly 230 comprises a substantially complete ADL 122(1) formed over a carrier wafer. Layer 102 comprising die 106, insulator 112, and conductive through-connections 114 is disposed over bonding layer 124(1) over ADL 122(1). The particular process step illustrated in FIG. 3K may correspond to a stage of manufacturing between FIG. 2D and FIG. 2E.

In some embodiments, the carrier wafer bonded to assembly 350 may be removed by heating to 400 degrees Celsius for 4 minutes, allowing cleaving to occur, and de-bonding the carrier wafer from sacrificial stop layer 306. In another example embodiment, the carrier wafer bonded to assembly 350 may be removed by rough grinding followed a precision silicon etch reaction that is stopped by sacrificial stop layer 306. A sequence of highly selective etching solutions may subsequently be used to remove sacrificial stop layer 306 and substrate layer 308.

FIG. 3L shows a schematic cross-sectional illustration of assembly 358 subsequent to forming bonding layer 124 over bottom interconnect layer 308 ADL 122. In some embodiments, bonding layer 124 may comprise low resistivity metals (e.g., copper, aluminum) in through-connections 126 and ILD as insulator 128, for example, to enable planarization and provide mechanical strength. The process may continue further as indicated in FIG. 2F.

Figure 4:
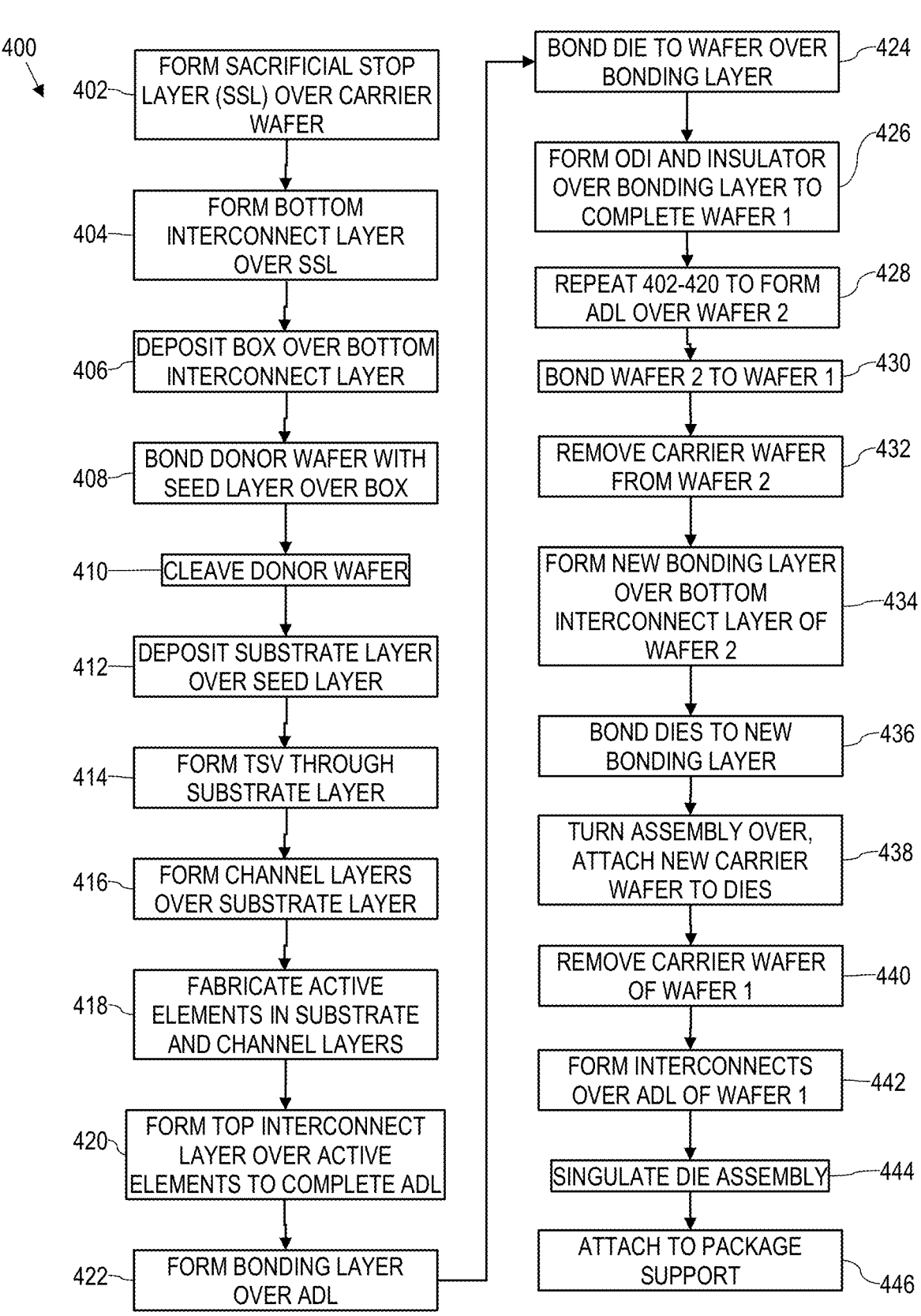
FIG. 4 is a flow diagram of an example method of fabricating an example die assembly with ADLs, according to various embodiments of the present disclosure.

FIG. 4 is a flow diagram of an example method 400 of fabricating die assembly 100, according to various embodiments of the present disclosure. Although FIG. 4 illustrates various operations performed in a particular order, this is simply illustrative, and the operations discussed herein may be reordered and/or repeated as suitable. Further, additional processes which are not illustrated may also be performed without departing from the scope of the present disclosure. Also, various ones of the operations discussed herein with respect to FIG. 4 may be modified in accordance with the present disclosure to fabricate others of die assembly 100 disclosed herein.

At 402, sacrificial stop layer 306 may be formed over carrier wafer 202. In some embodiments, sacrificial stop layer 306 may be grown by epitaxy over the surface of carrier wafer 202. At 404, bottom interconnect layer 308, comprising conductive metal traces 310 in ILD 312 and vias 314 may be formed over sacrificial stop layer 306 (e.g., FIG. 3A, 3B). At 406, BOX 322 may be deposited over bottom interconnect layer 308 (e.g., FIG. 3C). At 408, donor wafer 326 comprising seed layer 328 may be bonded over BOX 322 (e.g., FIG. 3D). At 410, donor wafer 326 may be cleaved and de-bonded from seed layer 328 (e.g., FIG. 3E). At 412, substrate layer 334 may be deposited over seed layer 328, for example, by epitaxy (e.g., FIG. 3F). In some embodiments, substrate layer 334 may comprise gallium nitride. At

414, TSV 338 may be formed in substrate layer 334, for example, by deep etching trenches and filling with conductive metal.

At 416, channel layers 342, 344 may be formed over substrate layer 334. In some embodiments, multiple layer transfers, for example, epitaxial liftoff processes, may be performed as needed. At 418, active elements 346 may be formed in substrate layer 334 and channel layers 342, 344 (e.g., FIG. 3H). At 420, top interconnect layer 352 may be fabricated, for example, with sequential planarization, patterning, plating, etching, etc. to form conductive metal traces 310 and vias 314 in ILD 312 over active elements 346, substantially completing formation of ADL 122 (e.g., FIG. 3I, FIG. 2A). At 422, bonding layer 124 may be formed over ADL 122 (e.g., FIG. 3J, FIG. 2B).

At 424, die 106 may be bonded to the wafer over bonding layer 124 (e.g., FIG. 2C). At 426, through-connections 114 in insulator 112 (e.g., ODI interconnects) may be formed over bonding layer 124 and around die 106 to complete reconstituted wafer 1, for example, comprising assembly 230 of FIG. 2D having surface 232. At 428, operations 402-420 may be repeated on another carrier wafer to generate another ADL 122 and form wafer 2. At 430, wafer 2 may be turned over and its top interconnect layer 352 bonded to surface 232 of reconstituted wafer 1 face-to-face with hybrid bond interconnects (or other suitable DTD interconnects) (e.g., FIG. 3K, FIG. 2E).

At 432, carrier wafer of wafer 2 may be removed, for example, by cleaving and/or debonding from sacrificial stop layer 362 (e.g., FIG. 3K). At 434, a new bonding layer 124 may be formed over bottom interconnect layer 308 (e.g., FIG. 3L, FIG. 2E). At 436, dies 108 may be bonded to new bonding layer 124 formed in operation 434 and dielectric deposited around them (e.g., FIG. 2F). At 438, the assembly may be turned over and a new carrier wafer 262 attached to dies 108 (e.g., FIG. 2G). At 440, the carrier wafer (e.g., 202) of reconstituted carrier wafer 1 may be de-bonded from sacrificial stop layer 306 thereof (e.g., FIG. 2H). At 442, interconnects 130 in insulator 132 may be formed over bottom interconnect layer 308 of ADL 122 in wafer 1. At 444, die assembly 100 may be singulated from the wafer. At 446, die assembly 100 may be attached to package support 282 with suitable interconnects 284 (e.g., FIG. 2I).

Although the operations of method 400 are illustrated in FIG. 4 once each and in a particular order, the operations may be performed in any suitable order and repeated as desired. For example, one or more operations may be performed in parallel to manufacture multiple IC packages substantially simultaneously. In another example, the operations may be performed in a different order to reflect the structure of a particular IC package in which one or more die assembly 100 as described herein may be included. Numerous variations also possible to achieve the desired structure of die assembly 100.

Furthermore, the operations illustrated in FIG. 4 may be combined or may include more details than described. Still further, method 400 shown in FIG. 4 may further include other manufacturing operations related to fabrication of other components of the semiconductor assemblies described herein, or any devices that may include semiconductor assemblies as described herein. For example, method 400 may include various cleaning operations, surface planarization operations (e.g., using CMP), operations for surface roughening, operations to include barrier and/or adhesion layers as desired, and/or operations for incorporating packages as described herein in, or with, an IC component, a computing device, or any desired structure or device.

Example Devices and Components

Figure 5:
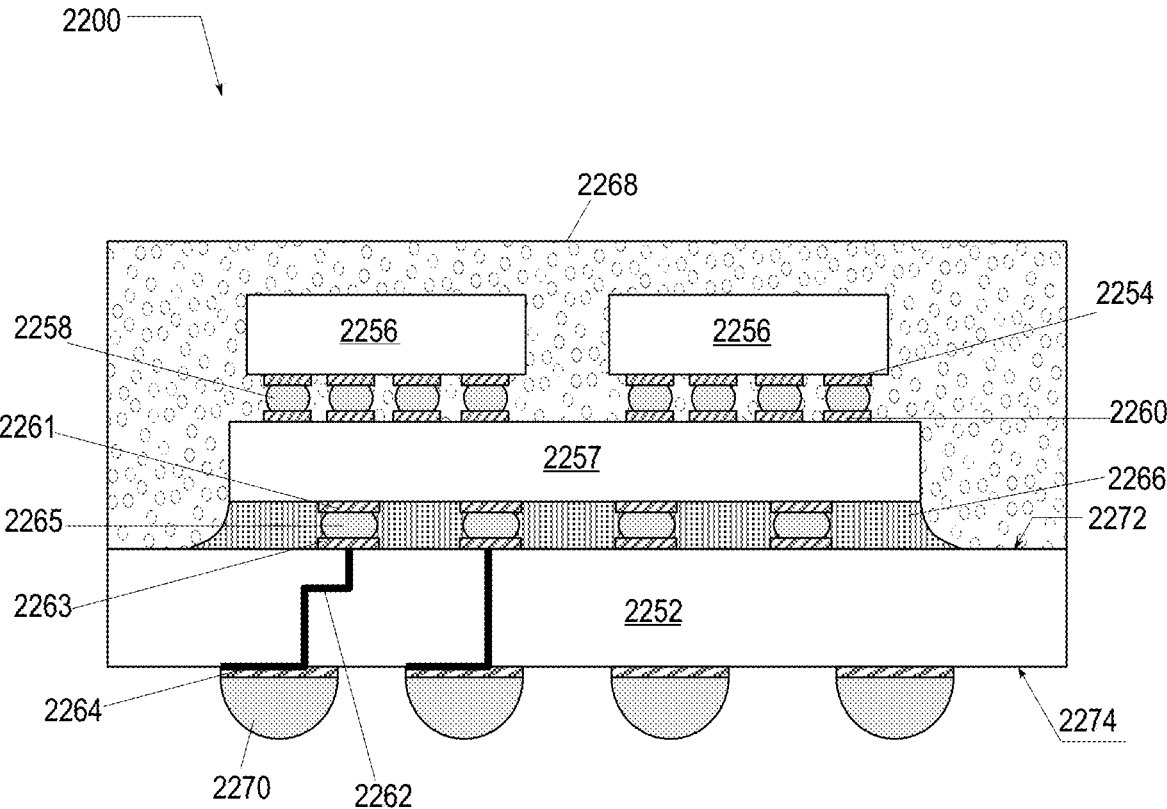
FIG. 5 is a cross-sectional view of a device package that includes one or more die assemblies with ADLs in accordance with any of the embodiments disclosed herein.
Figure 6:
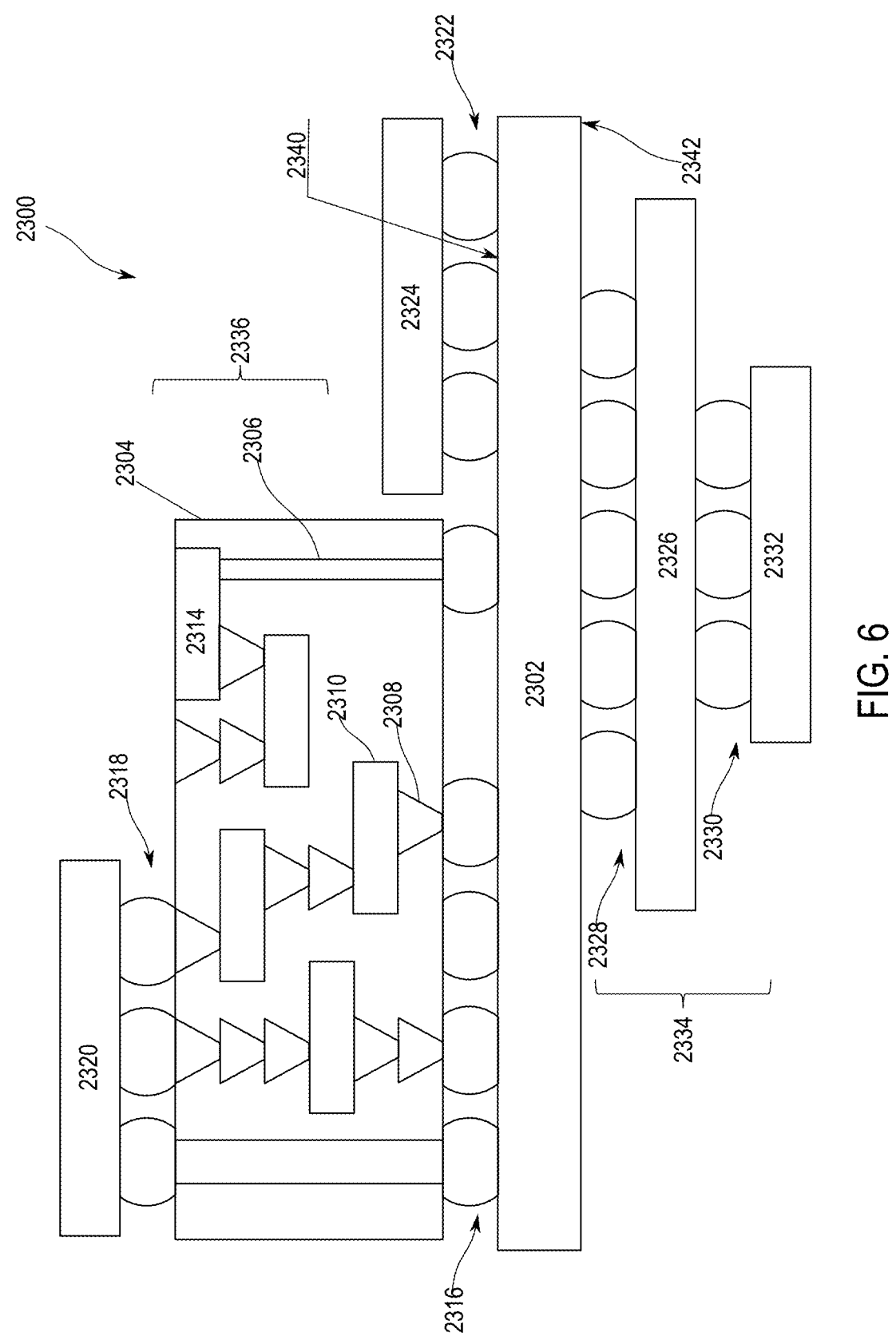
FIG. 6 is a cross-sectional side view of a device assembly that includes one or more die assemblies with ADLs in accordance with any of the embodiments disclosed herein.
Figure 7:
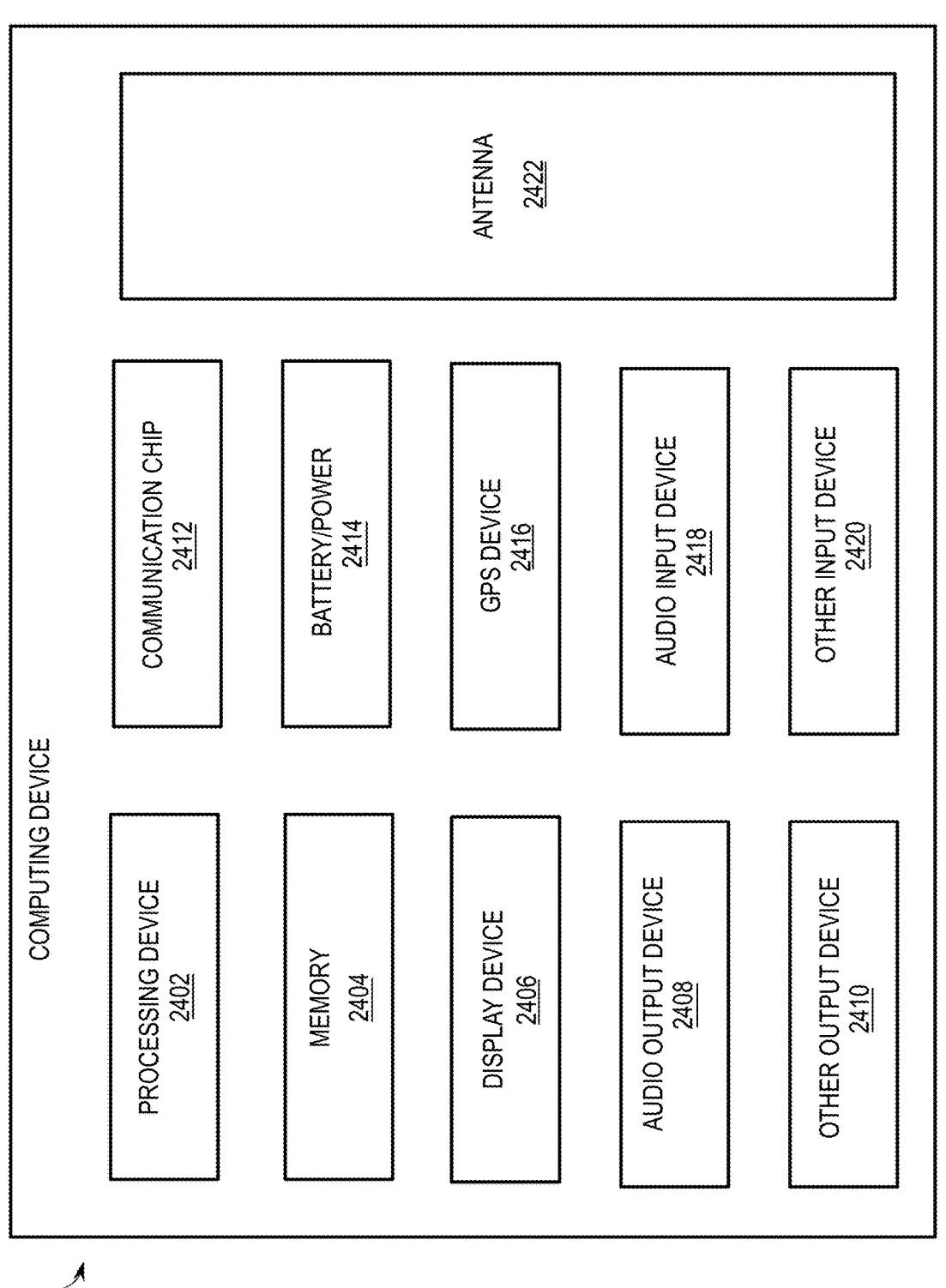
FIG. 7 is a block diagram of an example computing device that includes one or more die assemblies with ADLs in accordance with any of the embodiments disclosed herein.

The packages disclosed herein, e.g., any of the embodiments shown in FIGS. 1-3 or any further embodiments described herein, may be included in any suitable electronic component. FIGS. 5-7 illustrate various examples of packages, assemblies, and devices that may be used with or include any of the IC packages as disclosed herein.

FIG. 5 is a side, cross-sectional view of an example IC package 2200 that may include IC packages in accordance with any of the embodiments disclosed herein. In some embodiments, the IC package 2200 may be a system-in-package (SiP).

As shown in the figure, package substrate 2252 may be formed of an insulator (e.g., a ceramic, a buildup film, an epoxy film having filler particles therein, etc.), and may have conductive pathways extending through the insulator between first face 2272 and second face 2274, or between different locations on first face 2272, and/or between different locations on second face 2274. These conductive pathways may take the form of any of the interconnect structures comprising lines and/or vias.

Package substrate 2252 may include conductive contacts 2263 that are coupled to conductive pathway 2262 through package substrate 2252, allowing circuitry within dies 2256 and/or interposer 2257 to electrically couple to various ones of conductive contacts 2264 (or to other devices included in package substrate 2252, not shown).

IC package 2200 may include interposer 2257 coupled to package substrate 2252 via conductive contacts 2261 of interposer 2257, first-level interconnects 2265, and conductive contacts 2263 of package substrate 2252. First-level interconnects 2265 illustrated in the figure are solder bumps, but any suitable first-level interconnects 2265 may be used, such as solder bumps, solder posts, or bond wires.

IC package 2200 may include one or more dies 2256 coupled to interposer 2257 via conductive contacts 2254 of dies 2256, first-level interconnects 2258, and conductive contacts 2260 of interposer 2257. Conductive contacts 2260 may be coupled to conductive pathways (not shown) through interposer 2257, allowing circuitry within dies 2256 to electrically couple to various ones of conductive contacts 2261 (or to other devices included in interposer 2257, not shown). First-level interconnects 2258 illustrated in the figure are solder bumps, but any suitable first-level interconnects 2258 may be used, such as solder bumps, solder posts, or bond wires. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, underfill material 2266 may be disposed between package substrate 2252 and interposer 2257 around first-level interconnects 2265, and mold 2268 may be disposed around dies 2256 and interposer 2257 and in contact with package substrate 2252. In some embodiments, underfill material 2266 may be the same as mold 2268. Example materials that may be used for underfill material 2266 and mold 2268 are epoxies as suitable. Second-level interconnects 2270 may be coupled to conductive contacts 2264. Second-level interconnects 2270 illustrated in the figure are solder balls (e.g., for a ball grid array (BGA) arrangement), but any suitable second-level interconnects 2270 may be used (e.g., pins in a pin grid array arrangement or lands in a land grid array arrangement). Second-level interconnects 2270 may be used to couple IC package 2200 to another component, such as a circuit board (e.g., a motherboard), an interposer, or another IC package, as known in the art and as discussed below with reference to FIG. 6.

In various embodiments, any of dies 2256 may be die assembly 100 as described herein. In embodiments in which IC package 2200 includes multiple dies 2256, IC package 2200 may be referred to as a multi-chip package (MCP). Dies 2256 may include circuitry to perform any desired functionality. For example, besides one or more of dies 2256 being die assembly 100 as described herein, one or more of dies 2256 may be logic dies (e.g., silicon-based dies), one or more of dies 2256 may be memory dies (e.g., high bandwidth memory), etc. In some embodiments, any of dies 2256 may be implemented as discussed with reference to any of the previous figures. In some embodiments, at least some of dies 2256 may not include implementations as described herein.

Although IC package 2200 illustrated in the figure is a flip-chip package, other package architectures may be used. For example, IC package 2200 may be a BGA package, such as an embedded wafer-level ball grid array (eWLB) package. In another example, IC package 2200 may be a wafer-level chip scale package (WLCSP) or a panel fan-out (FO) package. Although two dies 2256 are illustrated in IC package 2200, IC package 2200 may include any desired number of dies 2256. IC package 2200 may include additional passive components, such as surface-mount resistors, capacitors, and inductors disposed over first face 2272 or second face 2274 of package substrate 2252, or on either face of interposer 2257. More generally, IC package 2200 may include any other active or passive components known in the art.

In some embodiments, no interposer 2257 may be included in IC package 2200; instead, dies 2256 may be coupled directly to conductive contacts 2263 at first face 2272 by first-level interconnects 2265.

FIG. 6 is a cross-sectional side view of an IC device assembly 2300 that may include components having one or more microelectronic assembly 200 in accordance with any of the embodiments disclosed herein. IC device assembly 2300 includes a number of components disposed over a circuit board 2302 (which may be, e.g., a motherboard). IC device assembly 2300 includes components disposed over a first face 2340 of circuit board 2302 and an opposing second face 2342 of circuit board 2302; generally, components may be disposed over one or both faces 2340 and 2342. In particular, any suitable ones of the components of IC device assembly 2300 may include any of the one or more microelectronic assembly 200 in accordance with any of the embodiments disclosed herein; e.g., any of the IC packages discussed below with reference to IC device assembly 2300 may take the form of any of the embodiments of IC package 2200 discussed above with reference to FIG. 5.

In some embodiments, circuit board 2302 may be a PCB including multiple metal layers separated from one another by layers of insulator and interconnected by electrically conductive vias. Any one or more of the metal layers may be formed in a desired circuit pattern to route electrical signals (optionally in conjunction with other metal layers) between the components coupled to circuit board 2302. In other embodiments, circuit board 2302 may be a non-PCB package substrate.

As illustrated in the figure, in some embodiments, IC device assembly 2300 may include a package-on-interposer structure 2336 coupled to first face 2340 of circuit board 2302 by coupling components 2316. Coupling components 2316 may electrically and mechanically couple package-oninterposer structure 2336 to circuit board 2302, and may include solder balls (as shown), male and female portions of a socket, an adhesive, an underfill material, and/or any other suitable electrical and/or mechanical coupling structure.

Package-on-interposer structure 2336 may include IC package 2320 coupled to interposer 2304 by coupling components 2318. Coupling components 2318 may take any suitable form depending on desired functionalities, such as the forms discussed above with reference to coupling components 2316. In some embodiments, IC package 2320 may be or include IC package 2200, e.g., as described above with reference to FIG. 5. In some embodiments, IC package 2320 may include at least one die assembly 100 as described herein. Die assembly 100 is not specifically shown in the figure in order to not clutter the drawing.

Although a single IC package 2320 is shown in the figure, multiple IC packages may be coupled to interposer 2304; indeed, additional interposers may be coupled to interposer 2304. Interposer 2304 may provide an intervening package substrate used to bridge circuit board 2302 and IC package 2320. Generally, interposer 2304 may redistribute a connection to a wider pitch or reroute a connection to a different connection. For example, interposer 2304 may couple IC package 2320 to a BGA of coupling components 2316 for coupling to circuit board 2302.

In the embodiment illustrated in the figure, IC package 2320 and circuit board 2302 are attached to opposing sides of interposer 2304. In other embodiments, IC package 2320 and circuit board 2302 may be attached to a same side of interposer 2304. In some embodiments, three or more components may be interconnected by way of interposer 2304.

Interposer 2304 may be formed of an epoxy resin, a fiberglass-reinforced epoxy resin, a ceramic material, or a polymer material such as polyimide. In some implementations, interposer 2304 may be formed of alternate rigid or flexible materials that may include the same materials described above for use in a semiconductor substrate, such as silicon, germanium, and other group III-V and group IV materials. Interposer 2304 may include metal interconnects 2308 and vias 2310, including but not limited to TSVs 2306. Interposer 2304 may further include embedded devices 2314, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as RF devices, power amplifiers, power management devices, antennas, arrays, sensors, and microelectromechanical systems (MEMS) devices may also be formed on interposer 2304. Package-on-interposer structure 2336 may take the form of any of the package-on-interposer structures known in the art.

In some embodiments, IC device assembly 2300 may include an IC package 2324 coupled to first face 2340 of circuit board 2302 by coupling components 2322. Coupling components 2322 may take the form of any of the embodiments discussed above with reference to coupling components 2316, and IC package 2324 may take the form of any of the embodiments discussed above with reference to IC package 2320.

In some embodiments, IC device assembly 2300 may include a package-on-package structure 2334 coupled to second face 2342 of circuit board 2302 by coupling components 2328. Package-on-package structure 2334 may include an IC package 2326 and an IC package 2332 coupled together by coupling components 2330 such that IC package 2326 is disposed between circuit board 2302 and IC package 2332. Coupling components 2328 and 2330 may take the form of any of the embodiments of coupling components 2316 discussed above, and IC packages 2326 and/or 2332 may take the form of any of the embodiments of IC package 2320 discussed above. Package-on-package structure 2334 may be configured in accordance with any of the package-on-package structures known in the art.

FIG. 7 is a block diagram of an example computing device 2400 that may include one or more components having one or more IC packages in accordance with any of the embodiments disclosed herein. For example, any suitable ones of the components of computing device 2400 may include ADL 122 at suitable interfaces 120, in accordance with any of the embodiments disclosed herein. In another example, any one or more of the components of computing device 2400 may include any embodiments of IC package 2200 (e.g., as shown in FIG. 5). In yet another example, any one or more of the components of computing device 2400 may include an IC device assembly 2300 (e.g., as shown in FIG. 6).

A number of components are illustrated in the figure as included in computing device 2400, but any one or more of these components may be omitted or duplicated, as suitable for the application. In some embodiments, some or all of the components included in computing device 2400 may be attached to one or more motherboards. In some embodiments, some or all of these components are fabricated onto a single SoC die.

Additionally, in various embodiments, computing device 2400 may not include one or more of the components illustrated in the figure, but computing device 2400 may include interface circuitry for coupling to the one or more components. For example, computing device 2400 may not include a display device 2406, but may include display device interface circuitry (e.g., a connector and driver circuitry) to which display device 2406 may be coupled. In another set of examples, computing device 2400 may not include an audio input device 2418 or an audio output device 2408, but may include audio input or output device interface circuitry (e.g., connectors and supporting circuitry) to which audio input device 2418 or audio output device 2408 may be coupled.

Computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. Processing device 2402 may include one or more digital signal processors (DSPs), ASICs, CPUs, GPUs, cryptoprocessors (specialized processors that execute cryptographic algorithms within hardware), server processors, or any other suitable processing devices. Computing device 2400 may include a memory 2404, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, memory 2404 may include memory that shares a die with processing device 2402. This memory may be used as cache memory and may include embedded dynamic random access memory (eDRAM) or spin transfer torque magnetic random access memory (STT-MRAM).

In some embodiments, computing device 2400 may include a communication chip 2412 (e.g., one or more communication chips). For example, communication chip

2412 may be configured for managing wireless communications for the transfer of data to and from computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

Communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High-Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. Communication chip 2412 may operate in accordance with other wireless protocols in other embodiments. Computing device 2400 may include an antenna 2422 to facilitate wireless communications and/or to receive other wireless communications (such as AM or FM radio transmissions).

In some embodiments, communication chip 2412 may manage wired communications, such as electrical, optical, or any other suitable communication protocols (e.g., the Ethernet). As noted above, communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

Computing device 2400 may include battery/power circuitry 2414. Battery/power circuitry 2414 may include one or more energy storage devices (e.g., batteries or capacitors) and/or circuitry for coupling components of computing device 2400 to an energy source separate from computing device 2400 (e.g., AC line power).

Computing device 2400 may include a display device 2406 (or corresponding interface circuitry, as discussed above). Display device 2406 may include any visual indicators, such as a heads-up display, a computer monitor, a projector, a touchscreen display, a liquid crystal display (LCD), a light-emitting diode display, or a flat panel display, for example.

Computing device 2400 may include audio output device 2408 (or corresponding interface circuitry, as discussed above). Audio output device 2408 may include any device that generates an audible indicator, such as speakers, headsets, or earbuds, for example.

Computing device 2400 may include audio input device 2418 (or corresponding interface circuitry, as discussed above). Audio input device 2418 may include any device that generates a signal representative of a sound, such as microphones, microphone arrays, or digital instruments (e.g., instruments having a musical instrument digital interface (MIDI) output).

Computing device 2400 may include a GPS device 2416 (or corresponding interface circuitry, as discussed above). GPS device 2416 may be in communication with a satellite-based system and may receive a location of computing device 2400, as known in the art.

Computing device 2400 may include other output device 2410 (or corresponding interface circuitry, as discussed above). Examples of other output device 2410 may include an audio codec, a video codec, a printer, a wired or wireless transmitter for providing information to other devices, or an additional storage device.

Computing device 2400 may include other input device 2420 (or corresponding interface circuitry, as discussed above). Examples of other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

Computing device 2400 may have any desired form factor, such as a handheld or mobile computing device (e.g., a cell phone, a smart phone, a mobile internet device, a music player, a tablet computer, a laptop computer, a net-book computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, computing device 2400 may be any other electronic device that processes data.

SELECT EXAMPLES

The following paragraphs provide various examples of the embodiments disclosed herein.

Example 1 provides a die assembly (e.g., 100), comprising: a first component layer (e.g., 102) having conductive through-connections (e.g., 114) in an insulator (e.g., 112); a second component layer (e.g., 104) comprising a die (e.g., 108); and an ADL (e.g., 122(2)) at an interface (e.g., 120(2)) between the first component layer and the second component layer. The ADL comprises active elements (e.g., 346) electrically coupled to the first component layer and the second component layer.

Example 2 provides the die assembly of example 1, further comprising a bonding layer (e.g., 124) electrically coupling the ADL to the second component layer.

Example 3 provides the die assembly of example 2, in which the bonding layer is between the ADL and the second component layer.

Example 4 provides the die assembly of any of examples 2-3, in which the bonding layer comprises conductive through-connections (e.g., 126) in an insulator (e.g., 128).

Example 5 provides the die assembly of example 4, in which the insulator comprises silicon oxide, silicon oxy-nitride, silicon nitride, or silicon carbon nitride.

Example 6 provides the die assembly of any of examples 4-5, in which the insulator comprises any combination of silicon oxide, silicon oxy-nitride, silicon nitride, and silicon carbon nitride.

Example 7 provides the die assembly of any of examples 1-6, in which the ADL further comprises a first interconnect layer (e.g., 308) and a second interconnect layer (e.g., 352) and the active elements are between the first interconnect layer and the second interconnect layer.

Example 8 provides the die assembly of example 7, in which the first component layer is coupled to the second interconnect layer (e.g., FIG. 3K, 3L).

Example 9 provides the die assembly of any of examples 7-8, further comprising a bonding layer between the first interconnect layer of the ADL and the second component layer (e.g., FIG. 3L).

Example 10 provides the die assembly of any of examples 7-9, in which the second interconnect layer and the first interconnect layer each comprises conductive metal traces (e.g., 310) and vias (e.g., 314) in ILD (e.g., 312).

Example 11 provides the die assembly of example 10, in which the conductive metal traces comprise tungsten, molybdenum or ruthenium.

Example 12 provides the die assembly of any of examples 7-11, in which the ADL further comprises TSVs (e.g., 338) between the first interconnect layer and the second interconnect layer.

Example 13 provides the die assembly of any of examples 7-12, in which the ADL further comprises bonding oxide (BOX) (e.g., 322) between the first interconnect layer and the second interconnect layer.

Example 14 provides the die assembly of any of examples 1-13, in which the active elements comprise source-drain-gate structures formed in a substrate layer (e.g., 334) comprising gallium nitride with silicon channels (e.g., 342, 344).

Example 15 provides the die assembly of any of examples 1-14, further comprising another ADL (e.g., 122(1)) at another interface (e.g., 120(1)) between the first component layer and a package support (e.g., 282), the another interface being opposite to the interface.

Example 16 provides the die assembly of example 15, further comprising another bonding layer (e.g., 124(1)) between the first component layer and the another ADL.

Example 17 provides the die assembly of example 16, in which the another ADL further comprises another first interconnect layer and another second interconnect layer with the active elements in between, and the another bonding layer is coupled to the second interconnect layer (e.g., FIG. 3J).

Example 18 provides the die assembly of any of examples 1-17, in which the first layer and the second layer are electrically and mechanically coupled at the interface with hybrid bond interconnects.

Example 19 provides the die assembly of any of examples 1-18, further comprising another die (e.g., 106) in the first component layer.

Example 20 provides the die assembly of example 19, in which the another die comprises TSVs (e.g., 110).

Example 21 provides the die assembly of any of examples 1-20, in which the insulator of the first component layer comprises silica filled epoxy.

Example 22 provides an ADL (e.g., 122) comprising: a first interconnect layer (e.g., 308); a substrate layer (e.g., 334); and a second interconnect layer (e.g., 352). The ADL is at an interface (e.g., 120) between two component layers (e.g., 102, 104) of an IC package, and the substrate layer includes active elements (e.g., 346) electrically coupled to the first interconnect layer and the second interconnect layer.

Example 23 provides the ADL of example 22, further comprising TSVs (e.g., 338) through the substrate.

Example 24 provides the ADL of any of examples 22-23, in which the first interconnect layer and the second interconnect layer comprise conductive metal traces (e.g., 310) and vias (e.g., 314) in ILD (e.g., 312).

Example 25 provides the ADL of any of examples 22-24, in which the substrate layer comprises gallium nitride with silicon channels.

Example 26 provides the ADL of any of examples 22-25, in which the active elements are fabricated using multiple layer transfers.

Example 27 provides the ADL of any of examples 22-26, further comprising BOX (e.g., 322) between the first interconnect layer and the substrate layer.

Example 28 provides the ADL of any of examples 22-27, in which at least one of the two component layers of the IC package comprises dies embedded in an insulator (e.g., 112).

Example 29 provides the ADL of example 28, in which the insulator comprises silica filled epoxy.

Example 30 provides the ADL of any of examples 22-29, in which the two component layers of the IC package are coupled with hybrid bond interconnects.

Example 31 provides the ADL of any of examples 22-30, in which a bonding layer is between the ADL and at least one of the two component layers of the IC package.

Example 32 provides a method, comprising: forming an ADL (e.g., 122(1)); forming a bonding layer (e.g., 124(1)) over the ADL; coupling a first component layer (e.g., 102) of an IC package over the bonding layer; coupling another ADL (e.g., 122(2)) over the first component layer; forming another bonding layer (e.g., 124(2)) over the another ADL; coupling a second component layer (e.g., 104) of the IC package over the another bonding layer; forming conductive bond pads on the ADL; singulating into individual die assemblies; and coupling the individual die assemblies to corresponding package supports.

Example 33 provides the method of example 32, in which forming the ADL comprises: forming a sacrificial stop layer (e.g., 306) over a carrier wafer (e.g., 202); forming a first interconnect layer (e.g., 308) over the sacrificial stop layer; depositing BOX over the first interconnect layer; bonding a donor wafer (e.g., 326) comprising a seed layer (e.g., 328) over the BOX; cleaving the donor wafer from the seed layer; forming a substrate layer (e.g., 334) over the seed layer; forming TSVs (e.g., 338) in the substrate layer; depositing one or more channel layers (e.g., 342, 344) over the substrate layer; forming active elements (e.g., 346) in the substrate layer and the one or more channel layers; and fabricating a second interconnect layer (e.g., 352) over the active elements.

Example 34 provides the method of example 33, in which the bonding layer is formed over the second interconnect layer.

Example 35 provides the method of any of examples 33-34, in which the sacrificial stop layer is grown by epitaxy over a surface of the carrier wafer.

Example 36 provides the method of any of examples 33-35, in which the carrier wafer comprises monocrystalline silicon, and the sacrificial stop layer comprises hydrogen in the monocrystalline silicon.

Example 37 provides the method of any of examples 33-36, in which the first interconnect layer comprises conductive metal traces (e.g., 310) and vias (e.g., 314) in ILD (e.g., 312).

Example 38 provides the method of any of examples 33-37, in which the substrate layer is formed by epitaxy.

Example 39 provides the method of any of examples 33-38, in which the substrate layer comprises gallium nitride.

Example 40 provides the method of any of examples 33-39, in which the TSVs are formed by etching deep trenches in the substrate and depositing conductive metal therein.

Example 41 provides the method of any of examples 33-40, in which the channel layers are deposited using epitaxial liftoff in one or more layer transfer processes.

Example 42 provides the method of any of examples 32-41, in which coupling the first component layer comprises: bonding a die (e.g., 106) over the bonding layer; depositing copper pillars (e.g., 114) over the bonding layer around the die; depositing insulator around the copper pillars and the die, such that the copper pillars form through-connections through the insulator.

Example 43 provides the method of any of examples 32-42, in which coupling the another ADL comprises: fabricating the another ADL on a carrier wafer; turning over the carrier wafer and bonding a second interconnect layer of the another ADL to a surface of the first component layer with hybrid bond interconnects; and debonding the carrier wafer.

Example 44 provides the method of any of examples 32-43, in which the another ADL comprises a second interconnect layer and a first interconnect layer, and the another bonding layer is formed over the first interconnect layer of the another ADL.

Example 45 provides the method of any of examples 32-44, in which forming conductive bond pads on the ADL comprises: attaching a carrier wafer to the second component layer; exposing a surface of the ADL opposite to the first component layer; and depositing conductive metal on the ADL to form conductive bond pads.

Example 46 provides the method of example 45, in which exposing the surface of the ADL comprises debonding another carrier wafer attached to the surface.

Example 47 provides the method of example 46, in which debonding the another carrier wafer comprises heating for a duration of time to separate the another carrier wafer along a sacrificial stop layer therein.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

The invention claimed is:

1. A die assembly, comprising:
a first component layer having conductive through-connections in an insulator;
a second component layer comprising a die; and
a layer at an interface between the first component layer and the second component layer, wherein the layer includes active elements electrically coupled to the first component layer and the second component layer.

2. The die assembly of claim 1, further comprising a bonding layer electrically coupling the layer to the second component layer, wherein the bonding layer comprises conductive through-connections in an insulator.

3. The die assembly of claim 1, wherein the layer further comprises a first interconnect layer and a second interconnect layer and the active elements are between the first interconnect layer and the second interconnect layer.

4. The die assembly of claim 3, wherein the first interconnect layer and the second interconnect layer each comprises conductive metal traces and vias in interlayer dielectric (ILD).

5. The die assembly of claim 4, wherein the conductive metal traces comprise tungsten, molybdenum or ruthenium.

6. The die assembly of claim 1, wherein the active elements comprise source-drain-gate structures formed in a substrate layer comprising gallium nitride with silicon channels.

7. The die assembly of claim 1, further comprising another die in the first component layer.

8. The die assembly of claim 1, wherein the insulator of the first component layer comprises silica filled epoxy.

9. A die assembly, comprising:
a first component layer having conductive through-connections in an insulator;
a second component layer comprising a die;
an active device layer (ADL) at an interface between the first component layer and the second component layer, wherein the ADL comprises active elements electrically coupled to the first component layer and the second component layer;
a bonding layer electrically coupling the ADL to the second component layer, wherein the bonding layer comprises conductive through-connections in an insulator; and
another ADL at another interface between the first component layer and a package support, wherein the another interface is opposite to the interface.

10. The die assembly of claim 9, further comprising another bonding layer between the first component layer and the another ADL.

11. The die assembly of claim 10, wherein the another ADL further comprises another first interconnect layer and another second interconnect layer with the active elements in between, and the another bonding layer is coupled to the second interconnect layer.

12. The die assembly of claim 9, wherein the insulator of the first component layer comprises silica filled epoxy.

13. The die assembly of claim 9, wherein the insulator of the bonding layer comprises silicon oxide, silicon oxynitride, silicon nitride, or silicon carbon nitride.

14. The die assembly of claim 9, wherein the active elements comprise source-drain-gate structures formed in a substrate layer comprising gallium nitride with silicon channels.

*  *  *  *  *